(12) United States Patent
Kim et al.

(10) Patent No.: US 11,276,838 B2
(45) Date of Patent: Mar. 15, 2022

(54) LIGHT EMITTING DISPLAY APPARATUS

(71) Applicant: LG Display Co., Ltd., Seoul (KR)

(72) Inventors: Taemin Kim, Paju-si (KR); Wonhoe Koo, Goyang-si (KR); JiHyeon Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/886,140

(22) Filed: May 28, 2020

(65) Prior Publication Data

US 2021/0020865 A1    Jan. 21, 2021

(30) Foreign Application Priority Data

Jul. 19, 2019  (KR) .................. 10-2019-0087428

(51) Int. Cl.
*H01L 51/52* (2006.01)
*H01L 27/32* (2006.01)
*H01L 51/50* (2006.01)

(52) U.S. Cl.
CPC ........ *H01L 51/5253* (2013.01); *H01L 27/323* (2013.01); *H01L 27/3206* (2013.01); *H01L 51/5056* (2013.01); *H01L 51/5072* (2013.01); *H01L 51/5246* (2013.01); *H01L 51/5275* (2013.01); *H01L 51/5293* (2013.01); *H01L 2251/301* (2013.01)

(58) Field of Classification Search
CPC ............. H01L 51/5253; H01L 51/5293; H01L 51/5275; H01L 27/3206
See application file for complete search history.

(56) References Cited

U.S. PATENT DOCUMENTS

2017/0294493 A1* 10/2017 Yoo ..................... H01L 27/3218
2018/0373372 A1   12/2018 Kim et al.
2021/0175468 A1*  6/2021 Lee ........................ H01L 27/322

FOREIGN PATENT DOCUMENTS

KR  10-2011-0056012 A    5/2011
KR  10-2019-0000553 A    1/2019

* cited by examiner

*Primary Examiner* — Anthony Ho
(74) *Attorney, Agent, or Firm* — Birch, Stewart, Kolasch & Birch, LLP

(57) ABSTRACT

A light emitting display apparatus according to an exemplary embodiment of the present disclosure includes a plurality of light emitting elements on a substrate, an encapsulation part on the plurality of light emitting elements, a plurality of light collecting patterns on the encapsulation part and formed of an inorganic material, and an organic layer on the encapsulation part and the plurality of light collecting patterns and formed of a material having a refractive index lower than a refractive index of the plurality of light collecting patterns.

29 Claims, 14 Drawing Sheets

LIGHT EMITTING DISPLAY APPARATUS

CROSS-REFERENCE TO RELATED APPLICATIONS

This application claims the priority benefit of Korean Patent Application No. 10-2019-0087428 filed on Jul. 19, 2019, the entirety of which is hereby expressly incorporated by reference into the present application.

BACKGROUND

Technical Field

The present disclosure relates to a light emitting display apparatus, and more particularly, to a light emitting display apparatus capable of improving a front light collecting efficiency of light emitted from a light emitting element and at the same time, capable of improving a color viewing angle.

Description of the Related Art

Recently, as our society advances toward an information-oriented society, the field of a display apparatus for visually expressing an electrical information signal has rapidly advanced. Various display apparatuses, having excellent performance in terms of thinness, lightness, and low power consumption, are being developed correspondingly.

Among various display apparatus, a light emitting display apparatus is a self-light emitting display apparatus in which a separate light source is not needed, which is different from a liquid crystal display apparatus. Therefore, the light emitting display apparatus can be manufactured to have lightness and thinness. In addition, the light emitting display apparatus has advantages in terms of power consumption due to a low voltage driving, and is excellent in terms of a color implementation, a response speed, a viewing angle, and a contrast ratio (CR). Therefore, light emitting display apparatuses are expected to be utilized in various fields.

SUMMARY

Light emitted from a light emitting layer of a light emitting display apparatus can come out of the light emitting display apparatus through various components of the light emitting display apparatus. However, some of the light emitted from the light emitting layer can be extracted in a lateral direction of the light emitting display apparatus, which can lead to a limitation in front brightness.

For example, when the light emitted from the light emitting element travels to an interface between a high refractive layer and a low refractive layer disposed above the light emitting element, it can travel at an incident angle smaller than a critical angle. In this case, the light emitted from the light emitting element is refracted to have a refractive angle greater than the incident angle and can be emitted outwardly. At this time, the light emitted outwardly can travel in the lateral direction of the light emitting display apparatus. Therefore, the light emitted from the light emitting element can be refracted to have a refractive angle greater than an initial incident angle at an interface formed by layers having different refractive indices, and thus, can be dispersed at various angles. This is a factor in lowering the light extraction efficiency of the light emitting display apparatus, and a defect in which the front brightness decreases can occur.

Accordingly, the present inventors of the present disclosure have invented a new and improved light emitting display apparatus having a new structure, capable of improving a front light extraction efficiency.

An aspect of the present disclosure is to provide a light emitting display apparatus that is capable of improving a light extraction efficiency of light emitted from a light emitting element.

Another aspect of the present disclosure is to provide a light emitting display apparatus capable of having an improved front brightness.

Another aspect of the present disclosure is to provide a light emitting display apparatus capable of improving a front brightness and a color viewing angle, simultaneously.

Another aspect of the present disclosure is to provide a light emitting display apparatus capable of minimizing light traveling in a lateral direction of the light emitting display apparatus by adjusting a light emission angle of the light emitted from the light emitting element.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an aspect of the present disclosure, a light emitting display apparatus can include a plurality of light emitting elements on a substrate; an encapsulation part on the plurality of light emitting elements; a plurality of light collecting patterns on the encapsulation part and formed of an inorganic material; and an organic layer on the encapsulation part and the plurality of light collecting patterns and formed of a material having a refractive index lower than a refractive index of the plurality of light collecting patterns. Thus, the plurality of light collecting patterns can reduce an incident angle of at least a portion of light directed in a lateral direction of the light emitting display apparatus to thereby refract the light in a front direction of the substrate or minimize totally reflected light.

According to another aspect of the present disclosure, a light emitting display apparatus can include a substrate including a light emitting area and a non-light emitting area; a light emitting element at the light emitting area, and configured to emit light at a light emission angle; an encapsulation part on the light emitting element; and a light collecting part being in contact with an upper surface of the encapsulation part and configured to collect the light emitted from the light emitting element, in a front direction, rather than at the light emission angle, wherein the light collecting part includes a plurality of light collecting patterns and an organic layer disposed to cover the plurality of light collecting patterns and having a refractive index lower than a refractive index of the plurality of light collecting patterns, whereby viewing angle properties and brightness of the light emitting display apparatus can be improved.

According to another aspect of the present disclosure, a light emitting display apparatus can include a substrate including a light emitting area and a non-light emitting area; a light emitting element at the light emitting area, and configured to emit light at a light emission angle; an encapsulation part on the light emitting element; a light collecting part being in contact with an upper surface of the encapsulation part and configured to collect the light emitted from the light emitting element, in a front direction, rather than at the light emission angle, wherein the light collecting part includes a plurality of light collecting patterns and an organic layer disposed to cover the plurality of light collecting patterns, and the organic layer has a refractive index lower than a refractive index of the plurality of light collecting patterns; and a touch part on the encapsulating part, wherein the touch part includes a first inorganic insulating layer on the encapsulation part, a second inorganic insulating layer on the first inorganic insulating layer, and a touch line on the first inorganic insulating layer or the second inorganic insulating layer, and wherein the plurality of light collecting patterns are configured to include a first layer disposed in the same layer as the first inorganic insulating layer, and a second layer on the first layer and disposed in the same layer as the second inorganic insulating layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to an embodiment of the present disclosure, a utilization rate of light emitted from the light emitting element can increase, so that the efficiency and power consumption of the light emitting display apparatus can be improved.

According to an embodiment of the present disclosure, the light emitted from the light emitting element can be extracted in the front direction, as much as possible.

According to an embodiment of the present disclosure, with the use of the light collecting part, the front brightness can increase and at the same time, a color viewing angle can also be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
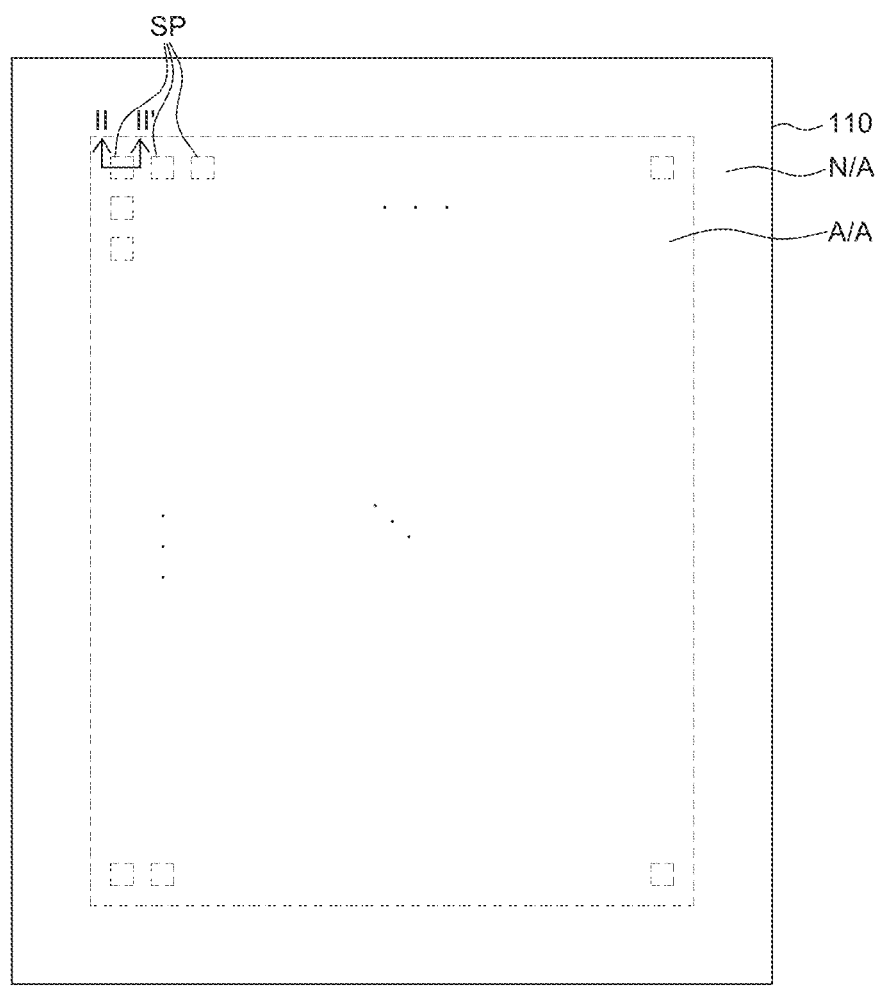
FIG. 1 is a schematic plan view of a light emitting display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

Although the terms "first", "second", and the like are used for describing various components, these components are not confined by these terms and do not define any order. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is a plan view of a light emitting display apparatus according to an exemplary embodiment of the present disclosure. All the components of the light emitting display apparatus according to all embodiments of the present disclosure are operatively coupled and configured. FIG. 1 illustrates only a substrate 110 and a plurality of sub-pixels SP among various components of a light emitting display apparatus 100 for convenience of description.

Referring to FIG. 1, the substrate 110 is a support member for supporting other components of the light emitting display apparatus 100 and can be formed of an insulating material. For example, the substrate 110 can be formed of glass, resin or the like. In addition, the substrate 110 can be formed of a polymer or plastic such as polyimide (PI) or the like, or can be formed of a material having flexibility.

The substrate 110 includes a display area A/A and a non-display area N/A.

The display area A/A is an area for displaying an image. In the display area A/A, the plurality of sub-pixels SP for displaying an image and a circuit part for driving the plurality of sub-pixels SP can be disposed. The circuit part can include various thin film transistors, capacitors, and wirings for driving the sub-pixels SP. For example, the circuit part can include various components such as a driving thin film transistor, a switching thin film transistor, a storage capacitor, a gate wiring, and a data wiring, but is not limited thereto.

The non-display area N/A is an area where no image is displayed. In the non-display area N/A, various wirings, driving ICs or the like for driving the sub-pixels SP disposed in the display area A/A are disposed. For example, various driving ICs such as a gate driver IC and a data driver IC can be disposed in the non-display area N/A.

FIG. 1 illustrates that the non-display area N/A surrounds the display area A/A. However, the non-display area N/A can be an area extending from one side of the display area A/A, but is not limited thereto.

The plurality of sub-pixels SP are disposed in the display area A/A of the substrate 110. Each of the plurality of sub-pixels SP is a separate emitting light part, and a light emitting element and a driving circuit are formed in each of the plurality of sub-pixels SP. For example, the plurality of sub-pixels SP can include a red sub-pixel, a green sub-pixel, and a blue sub-pixel, but the present disclosure is not limited thereto, and the plurality of sub-pixels SP can further include a white sub-pixel.

Hereinafter, a more detailed description of the plurality of sub-pixels SP is provided with reference to FIG. 2.

Figure 2:
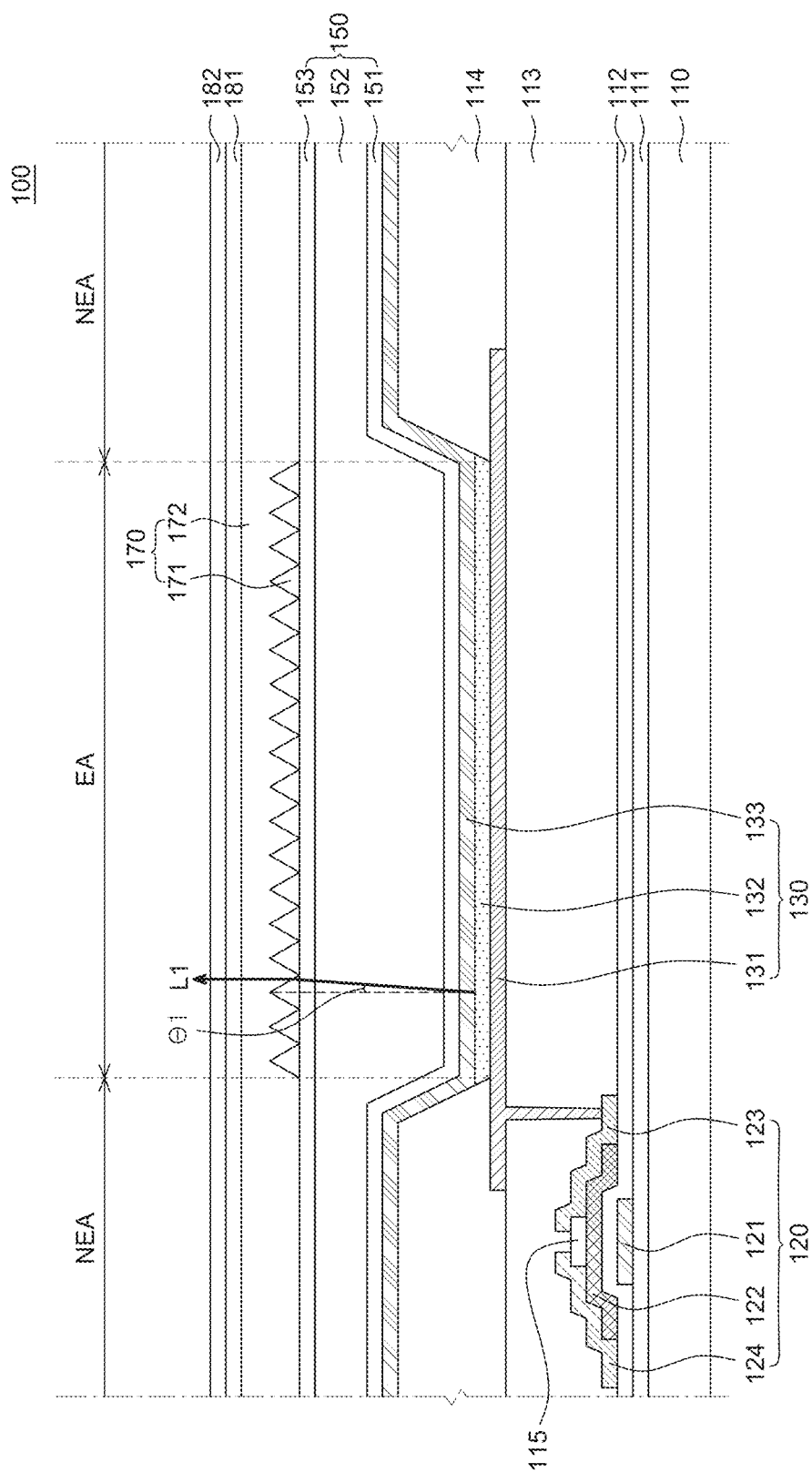
FIG. 2 is a schematic cross-sectional view taken along line II-II' of FIG. 1.

FIG. 2 is a cross-sectional view taken along line II-II' of FIG. 1.

With reference to FIG. 2, the light emitting display apparatus 100 according to an exemplary embodiment of the present disclosure includes the substrate 110, a thin film transistor 120, a light emitting element 130, an encapsulation part 150, and a light collecting part 170.

With reference to FIG. 2, a buffer layer 111 is disposed on the substrate 110. The buffer layer 111 can improve adhesion between layers formed on the buffer layer 111 and the substrate 110 and can block an alkali component or the like, flowing out of the substrate 110. The buffer layer 111 can be formed as a single layer of silicon nitride (SiNx) or silicon oxide (SiOx) or a multiple layer of silicon nitride (SiNx) or silicon oxide (SiOx), but is not limited thereto. The buffer layer 111 can be omitted based on a type and material of the substrate 110 and a structure and type of the thin film transistor 120.

The thin film transistor 120 is disposed on the substrate 110. The thin film transistor 120 can be used as a driving element of the light emitting display apparatus 100. The thin film transistor 120 includes a gate electrode 121, an active layer 122, a source electrode 123, and a drain electrode 124. In the light emitting display apparatus 100 according to an exemplary embodiment of the present disclosure, the thin film transistor 120 has a structure in which the active layer 122 is disposed on the gate electrode 121, and the source electrode 123 and the drain electrode 124 are disposed on the active layer 122. Therefore, the thin film transistor 120 has a bottom gate structure in which the gate electrode 121 is disposed in the lowermost portion, but is not limited thereto.

The gate electrode 121 of the thin film transistor 120 is disposed on the substrate 110. The gate electrode 121 can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof. However, the gate electrode 121 is not limited thereto.

A gate insulating layer 112 is disposed on the gate electrode 121. The gate insulating layer 112 is a layer for electrically insulating the gate electrode 121 from the active layer 122 and can be formed of an insulating material. For example, the gate insulating layer 112 can be formed as a single layer of silicon nitride (SiNx) or silicon oxide (SiOx) which is an inorganic material or a multiple layer of silicon nitride (SiNx) or silicon oxide (SiOx), but is not limited thereto.

The active layer 122 is disposed on the gate insulating layer 112. The active layer 122 is disposed so as to overlap the gate electrode 121. For example, the active layer 122 can be formed of an oxide semiconductor or amorphous silicon (a-Si), polycrystalline silicon (poly-Si), or an organic semiconductor.

An etch stopper 115 is disposed on the active layer 122. The etch stopper 115 prevents damage to the surface of the active layer 122 due to plasma when the source electrode 123 and the drain electrode 124 are patterned by an etching method. One portion of the etch stopper 115 overlaps the source electrode 123 and the other portion of the etch stopper 115 overlaps the drain electrode 124. However, the etch stopper 115 can be omitted.

The source electrode 123 and the drain electrode 124 are disposed on the active layer 122 and the etch stopper 115. The source electrode 123 and the drain electrode 124 are disposed in the same layer and are spaced apart from each other. The source electrode 123 and the drain electrode 124 can be electrically connected to the active layer 122 to be in contact with the active layer 122. The source electrode 123 and the drain electrode 124 can be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof. However, the source electrode 123 and the drain electrode 124 are not limited thereto.

A planarization layer 113 is disposed on the thin film transistor 120. The planarization layer 113 can planarize upper portions of some areas of the substrate 110. For example, the planarization layer 113 can be disposed in the display area A/A, and the planarization layer 113 may not be disposed in the entirety or a portion of the non-display area N/A.

The planarization layer 113 can be configured to have a single layer or a plurality of layers and can be formed of an organic material. For example, the planarization layer 113 can be formed of an acrylic organic material, but is not limited thereto. The planarization layer 113 includes a contact hole for electrically connecting the thin film transistor 120 and the light emitting element 130 to each other.

The light emitting element 130 is disposed on the planarization layer 113. The light emitting element 130, a self-light emitting element, can be driven by receiving a voltage from the thin film transistor 120 or the like. The light emitting element 130 includes a first electrode 131, a light emitting layer 132, and a second electrode 133.

The first electrode 131 is separately disposed for each of the sub-pixels SP on the planarization layer 113. The first electrode 131 can be electrically connected to the thin film transistor 120 through the contact hole formed in the planarization layer 113. The first electrode 131 can be formed of a conductive material capable of supplying holes to the light emitting layer 132. For example, the first electrode 131 can be formed of a transparent conductive layer such as tin oxide (TO), indium tin oxide (ITO), indium zinc oxide (IZO), indium tin zinc oxide (ITZO) or the like, and a reflective layer formed of a material having excellent reflectivity such as silver (Ag) or an alloy of silver (Ag alloy), but is not limited thereto.

A bank 114 is disposed on the first electrode 131 and the planarization layer 113. The bank 114 is an insulating layer for distinguishing the sub-pixels SP adjacent to each other. The bank 114 can be disposed such that a portion of the first electrode 131 is opened, and can be an organic insulating material disposed to cover an edge or periphery of the first electrode 131.

The light emitting layer 132 is disposed on the first electrode 131. The light emitting layer 132 can have a separate structure for each sub-pixel SP. For example, the sub-pixels SP can include a red sub-pixel, a green sub-pixel and a blue sub-pixel, and in each of the sub-pixels SP, a red light emitting layer for emitting red light, a green light emitting layer for emitting green light, and a blue light emitting layer for emitting blue light are separately disposed. Each light emitting layer 132 can be pattern-deposited in each light emitting area EA using a mask opened for each sub-pixel SP, for example, a fine metal mask (FMM). The light emitting layer 132 can be an organic light emitting layer formed of an organic material, but is not limited thereto. For example, the light emitting layer 132 can be a quantum dot light emitting layer or a micro-LED. In addition, the light emitting layer 132 can further include a hole injection layer, a hole transporting layer, a hole blocking layer, an electron transporting layer, an electron injection layer, and an electron blocking layer. The hole injection layer, the hole transporting layer, and the electron blocking layer can be hole transfer layers. The electron transporting layer, the electron injection layer, and the hole blocking layer can be electron transfer layers. The hole transporting layer can be a hole transfer layer, and the electron transporting layer can be an electron transfer layer.

The light emitting layer 132 disposed in each of the plurality of sub-pixels SP can have a thickness capable of implementing a micro-cavity for an increase in brightness of the light emitting display apparatus 100. For example, the light emitting layer 132 is disposed separately in each of the plurality of sub-pixels SP, and light emitting layer 132 on each sub-pixel SP can be disposed to have a thickness capable of having a micro-cavity structure between the first electrode 131 and the second electrode 133.

For example, the thickness of the light emitting layer 132 of the light emitting element 130 can be adjusted such that a light emission angle of the light emitting element 130 disposed in each of the plurality of sub pixels SP is adjusted. The light emission angle of the light emitting element 130 and the thickness of the light emitting layer 132 corresponding thereto will be described later.

The second electrode 133 is disposed on the light emitting layer 132. The second electrode 133 is formed of a conductive material capable of supplying electrons to the light emitting layer 132. For example, the second electrode 133 can be formed of a transparent conductive oxide such as indium tin oxide (ITO), indium zinc oxide (IZO), indium tin zinc oxide (ITZO), zinc oxide (ZnO), and tin oxide (TO) or an alloy of ytterbium (Yb), but is not limited thereto. With reference to FIG. 2, the second electrodes 133 disposed in each of the sub-pixels SP are illustrated as being connected to each other. However, for example, similarly to the first electrode 131, the second electrode 133 can be separately disposed for each sub-pixel SP, but is not limited thereto.

The display area A/A can be a non-light emitting area NEA between a plurality of light emitting areas EA and a plurality of light emitting areas EA.

In the plurality of light emitting areas EA, the plurality of light emitting elements 130 are respectively disposed. The plurality of light emitting areas EA can each independently emit light of one color, can correspond to the plurality of sub-pixels SP, and can be areas where the bank 114 is not disposed. For example, the plurality of light emitting areas EA can include a red light emitting area, a green light emitting area, and a blue light emitting area, but are not limited thereto. The plurality of light emitting areas EA can be disposed to be spaced apart from each other, for example, can be disposed in a grid shape in which they are disposed in columns and rows, but they are not limited thereto.

The plurality of light emitting elements 130 are not disposed in the non-light emitting area NEA. The non-light emitting area NEA is disposed between the plurality of light emitting areas EA, and can be an area where the bank 114 is disposed. Since the non-light emitting area NEA is disposed to surround the plurality of light emitting areas EA, it can be formed in a mesh shape.

The encapsulation part 150 is disposed on the light emitting element 130. The encapsulation part 150 is a sealing member that protects the light emitting element 130 from external moisture, oxygen, and impacts. The encapsulation part 150 can be disposed to cover the entirety of the display area A/A in which the light emitting element 130 is disposed and can also be disposed to cover a portion of the non-display area N/A extending from the display area A/A. The encapsulation part 150 can include a first inorganic encapsulation layer 151 which is formed of an inorganic material, an organic encapsulation layer 152 which is disposed on the first inorganic encapsulation layer 151 and formed of an organic material, and a second inorganic encapsulation layer 153 which is disposed on the organic encapsulation layer 152.

The first inorganic encapsulation layer 151 seals the display area A/A to protect the light emitting element 130 from oxygen and moisture which penetrate into the display area A/A. The first inorganic encapsulation layer 151 can be disposed not only in the display area A/A, but also in the non-display area N/A extending from the display area A/A. The first inorganic encapsulation layer 151 is formed of an inorganic material, such as silicon nitride SiNx or silicon oxynitride SiON or the like, but is not limited thereto.

The organic encapsulation layer 152 is disposed on the first inorganic encapsulation layer 151. The organic encapsulation layer 152 planarizes an upper portion of the first inorganic encapsulation layer 151 and fills cracks which can occur in the first inorganic encapsulation layer 151. When foreign substances are disposed on the first inorganic encapsulation layer 151, the organic encapsulation layer 152 can planarize an upper portion of the foreign substances. The organic encapsulation layer 152 can be disposed in the display area A/A and a portion of the non-display area N/A extending from the display area A/A. The organic encapsulation layer 152 can be formed of an epoxy-based or acrylic-based polymer, but is not limited thereto.

The second inorganic encapsulation layer 153 is disposed on the organic encapsulation layer 152. The second inorganic encapsulation layer 153 can seal the organic encapsulation layer 152 together with the first inorganic encapsulation layer 151 by being in contact with the first inorganic encapsulation layer 151 at an outer portion of the light emitting display apparatus 100. The second inorganic encapsulation layer 153 can be disposed in the display area A/A and a portion of the non-display area N/A extending from the display area A/A. The second inorganic encapsulation layer 153 can be disposed to be in contact with the first inorganic encapsulation layer 151 disposed in the non-display area N/A. The second inorganic encapsulation layer 153 is formed of an inorganic material, such as silicon nitride SiNx or silicon oxynitride SiON, but is not limited thereto.

Refractive indices of the first inorganic encapsulation layer 151 and the second inorganic encapsulation layer 153 can be greater than a refractive index of the organic encapsulation layer 152. For example, when acrylic-based polymer is used for the organic encapsulation layer 152, the refractive index of the organic encapsulation layer 152 can be about 1.5 to 1.6, and other materials which can be used for the organic encapsulation layer 152 can also have a similar or the same refractive index. Further, when silicon nitride SiNx is used for the first inorganic encapsulation layer 151 and the second inorganic encapsulation layer 153, the refractive indices of the first inorganic encapsulation layer 151 and the second inorganic encapsulation layer 153 can be about 1.8, and other materials which can be used for the first inorganic encapsulation layer 151 and the second inorganic encapsulation layer 153 can also have a similar or the same refractive index. Therefore, the light emitted from the light emitting element 130 can be refracted or totally reflected from an interface of the first inorganic encapsulation layer 151 and the organic encapsulation layer 152 and an interface of the organic encapsulation layer 152 and the second inorganic encapsulation layer 153.

Although FIG. 2 illustrates that the encapsulation part 150 includes the first inorganic encapsulation layer 151, the organic encapsulation layer 152, and the second inorganic encapsulation layer 153, the number of inorganic encapsulation layers and the number of organic encapsulation layers 152 included in the encapsulation part 150 are not limited thereto.

The light emitted from the light emitting layer of the light emitting display apparatus passes through various components of the light emitting display apparatus to be released to the outside of the light emitting display apparatus. However, in the light emitted from the light emitting layer, there exists light extracted in a lateral direction, other than in a front direction, for example, in a vertical direction of a screen of the light emitting display apparatus. Accordingly, front brightness of the light emitting display apparatus can have a limitation. The present inventors of the present disclosure have recognized a defect in which light is not emitted in the front direction of the light emitting display apparatus by the encapsulation part 150 of the light emitting display apparatus. For example, when the light emitted from the light emitting element travels to an interface between a high refractive layer and a low refractive layer disposed above the light emitting element, it can travel at an incident angle smaller than a critical angle. In this case, the light emitted from the light emitting element can be refracted to have a refractive angle greater than the incident angle and emitted outwardly. Light emitted outwardly can travel in a lateral direction of the light emitting display apparatus. Therefore, the light emitted from the light emitting element can be refracted to have a refractive angle greater than an initial incident angle at an interface formed by layers having different refractive indices, and thus can be dispersed at various angles. This is a factor in lowering light extraction efficiency of the light emitting display apparatus, and a defect in which front brightness decreases can occur.

Accordingly, the present inventors of the present specification have conducted various experiments to reduce the defect in which light is not emitted by the encapsulation part 150 and to improve front brightness of the light emitting display apparatus. This will be described below.

With reference to FIG. 2, the light collecting part 170 is disposed on the encapsulation part 150. The light collecting part 170 is configured to collect the light emitted from the light emitting element 130, in the front direction, rather than at the light emission angle. The light collecting part 170 includes a plurality of light collecting patterns 171 and an organic layer 172.

The plurality of light collecting patterns 171 are disposed on the encapsulation part 150. For example, the plurality of light collecting patterns 171 can be disposed on the second inorganic encapsulation layer 153 to be in contact therewith. Also, the plurality of light collecting patterns 171 can be disposed in the light emitting area EA as illustrated in FIG. 2. For example, the plurality of light collecting patterns 171 can be disposed to overlap the plurality of light emitting elements 130. Since the plurality of light collecting patterns 171 overlap the plurality of light emitting elements 130, light emitted from the light emitting elements 130 can be efficiently collected by the plurality of light collecting patterns 171.

The plurality of light collecting patterns 171 are inorganic patterns formed of an inorganic material. The plurality of light collecting patterns 171 can be formed of an inorganic insulating material. For example, the plurality of light collecting patterns 171 can be formed of a material having the same refractive index as the second inorganic encapsulation layer 153 of the encapsulation 150, for example, a material having a refractive index of about 1.8. Accordingly, since the plurality of light collecting patterns 171 are formed of a material having the same refractive index as the second inorganic encapsulation layer 153, the light emitted from the light emitting element 130 can pass through an interface between the second inorganic encapsulation layer 153 and the plurality of light collecting patterns 171, without being refracted. The plurality of light collecting patterns 171 can be formed of silicon nitride (SiNx), but is not limited thereto. In addition, as long as the refractive index of the plurality of light collecting patterns 171 is the same as that of the second inorganic encapsulation layer 153, a material for configuring the plurality of light collecting patterns 171 is not necessarily limited to the inorganic material. In addition, although FIG. 2 illustrates the light collecting patterns 171 as being configured to have a single layer, the embodiment of the present disclosure is not limited thereto, and the light collecting patterns 171 can have a form in which a plurality of layers are stacked.

The light collecting pattern 171 can have a protruding shape. The plurality of light collecting patterns 171 can include surfaces inclined with respect to the center of each light collecting pattern 171. For example, the light collecting pattern 171 can have a shape of any one of a pyramidal lens, a hemispherical lens, a conical lens, a lenticular lens, a prismatic lens, and a concave lens. When the light collecting pattern 171 has a shape of a pyramidal lens, the light collecting pattern 171 can have a triangular shape in a cross-section thereof. For example, an inclination angle or a vertex angle of the light collecting pattern 171 can be adjusted according to light distribution depending on a light emission angle of the light emitting element 130 and a difference in refractive index between the light collecting pattern 171 and the organic layer 172. When the inclination angle of the light collecting pattern 171 is greater than 60 degrees, it has an excessively steep inclination shape, thereby leading to a degradation in reliability. For example, the vertex angle of the light collecting pattern 171 or the inclination angle of the light collecting pattern 171 can be 60 degrees or less.

The organic layer 172 is disposed on the plurality of light collecting patterns 171. The organic layer 172 can be disposed to planarize the plurality of light collecting patterns 171 and can be as a planarization layer. The organic layer 172 can be disposed not only in the light emitting area EA but also in the non-light emitting area NEA, and can be disposed in the entirety of the display area A/A.

The organic layer 172 can be formed of a material having a refractive index lower than a refractive index of the plurality of light collecting patterns 171. For example, an acrylic polymer can be used for the organic layer 172 and can have a refractive index of about 1.5 to 1.6. However, as long as the refractive index of the organic layer 172 is lower than the refractive index of the plurality of light collecting patterns 171, a material for configuring the organic layer 172 is not limited thereto. In addition, the organic layer 172 can be formed of a material that can planarize upper portions of the plurality of light collecting patterns 171.

A polarizing plate 182 is disposed on the organic layer 172. The polarizing plate 182 suppresses reflection of external light. For example, when the light emitting display apparatus 100 is used externally, external light can be introduced and reflected by a metal used as an electrode of the light emitting element 130 or metal electrodes disposed under the light emitting element 130. In this case, visibility of the light emitting display apparatus 100 can be lowered by the reflected light. Accordingly, the polarizing plate 182 polarizes light introduced from the outside, in a specific direction, and can prevent light reflected by a metal inside the light emitting display apparatus 100 from being emitted back to the outside of the light emitting display apparatus 100.

An adhesive layer 181 that bonds or attaches the light collecting part 170 and the polarizing plate 182 is disposed under the polarizing plate 182. The adhesive layer 181 disposed to be in contact with an upper surface of the organic layer 172 can be formed of a material having the same refractive index as the organic layer 172, but is not limited thereto.

Accordingly, in the light emitting display apparatus 100 according to the exemplary embodiment of the present disclosure, light extraction efficiency of the light emitting display apparatus 100 can be improved by disposing the light collecting part 170 on an upper portion of the encapsulation part 150. For example, the plurality of light collecting patterns 171 having a relatively high refractive index are disposed on the encapsulation part 150, and the organic layer 172 having a relatively low refractive index is disposed on the plurality of light collecting patterns 171. Accordingly, the light emitted from the light emitting element 130 is concentrated in the front direction at the interface between the plurality of light collecting patterns 171 and the organic layer 172, whereby front light extraction efficiency of the light emitting display apparatus 100 can be improved. For example, as illustrated in FIG. 2, when first light L1 having a first light emission angle θ1 with respect to a normal direction of the substrate 100 is emitted, the first light L1 can be collected in the front direction, for example, in the normal direction, rather than being collected at the first light emission angle θ1, at the interface between the plurality of light collecting patterns 171 and the organic layer 172. Accordingly, in the light emitting display apparatus 100 according to the exemplary embodiment of the present disclosure, front light extraction efficiency of the light emitting display apparatus 100 can be improved by disposing the light collecting part 170.

The present inventors of the present disclosure have found that light distribution is varied depending on the light emission angle of the light emitting element 130 and thus, an optimal light emission angle allowing for the use of the light collecting part 170 exists. Accordingly, a more detailed description of the light emission angle of the light emitting element 130 in the light emitting display apparatus 100 according to the exemplary embodiment of the present disclosure is provided with reference to FIG. 3A to FIG. 4C.

Figure 3A:
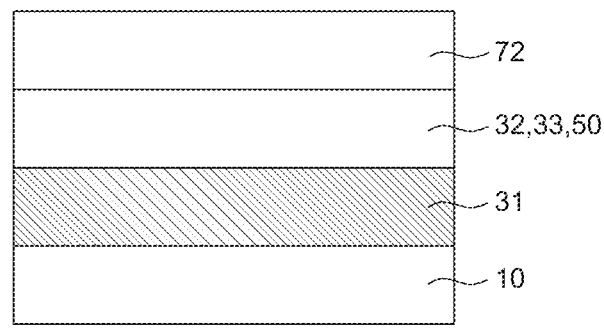
FIG. 3A and FIG. 3B are schematic cross-sectional views of a comparative example and an exemplary embodiment of the present disclosure.
Figure 3B:
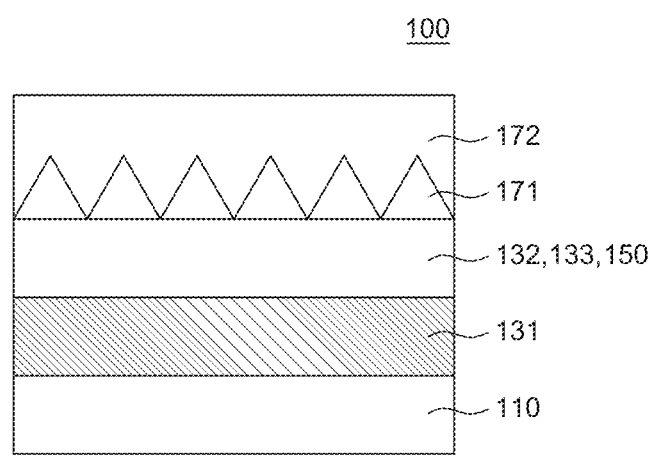

FIG. 3A and FIG. 3B are schematic cross-sectional views of a comparative example and an exemplary embodiment of the present disclosure. FIG. 4A to FIG. 4D are light distribution simulation results according to the comparative example and an exemplary embodiment of the present disclosure.

First, FIG. 3B schematically illustrates the light emitting display apparatus 100 according to an exemplary embodiment of the present disclosure. For simulation, it was assumed that a silver-palladium-copper alloy (APC) is disposed as the first electrode 131 on the substrate 110 formed of glass; a layer having a refractive index of 1.8 and configured to correspond to the light emitting layer 132, the second electrode 133, and the encapsulation part 150 is disposed on the first electrode 131; pyramidal patterns having a refractive index of 1.8 and configured to correspond to the plurality of light collecting patterns 171 are disposed on the encapsulation part 150, each pyramidal pattern having an equilateral triangular shape in a cross-section thereof; and a layer having a refractive index of 1.5 and configured to correspond to the organic layer 172 is disposed on the plurality of light collecting patterns 171. In addition, the comparative example shown in FIG. 3A is a light emitting display apparatus from which the plurality of light collecting patterns 171 of the light emitting display apparatus 100 according to an exemplary embodiment of the present disclosure are omitted. And, in the comparative example, it was assumed that a silver-palladium-copper alloy (APC) is disposed as a first electrode 31 on a substrate 10 formed of glass; a layer having a refractive index of 1.8 and configured to correspond to a light emitting layer 32, a second electrode 33, and an encapsulation part 50 is disposed on the first electrode 31; and a layer having a refractive index of 1.5 and configured to correspond to an organic layer 172 is disposed on the encapsulation part 50.

Next, in FIGS. 4A to 4D, Ray Optics Simulation was performed for structures of the comparative example and the exemplary embodiment described above, and light distribution simulation results were measured in the infinite far field of vision when light is emitted from the light emitting layers 32 and 132. In FIGS. 4A to 4D, light distribution simulation images and graphs indicate radiation intensity (W/sr) for each horizontal (H) angle and for each vertical (V) angle.

Figure 4A:
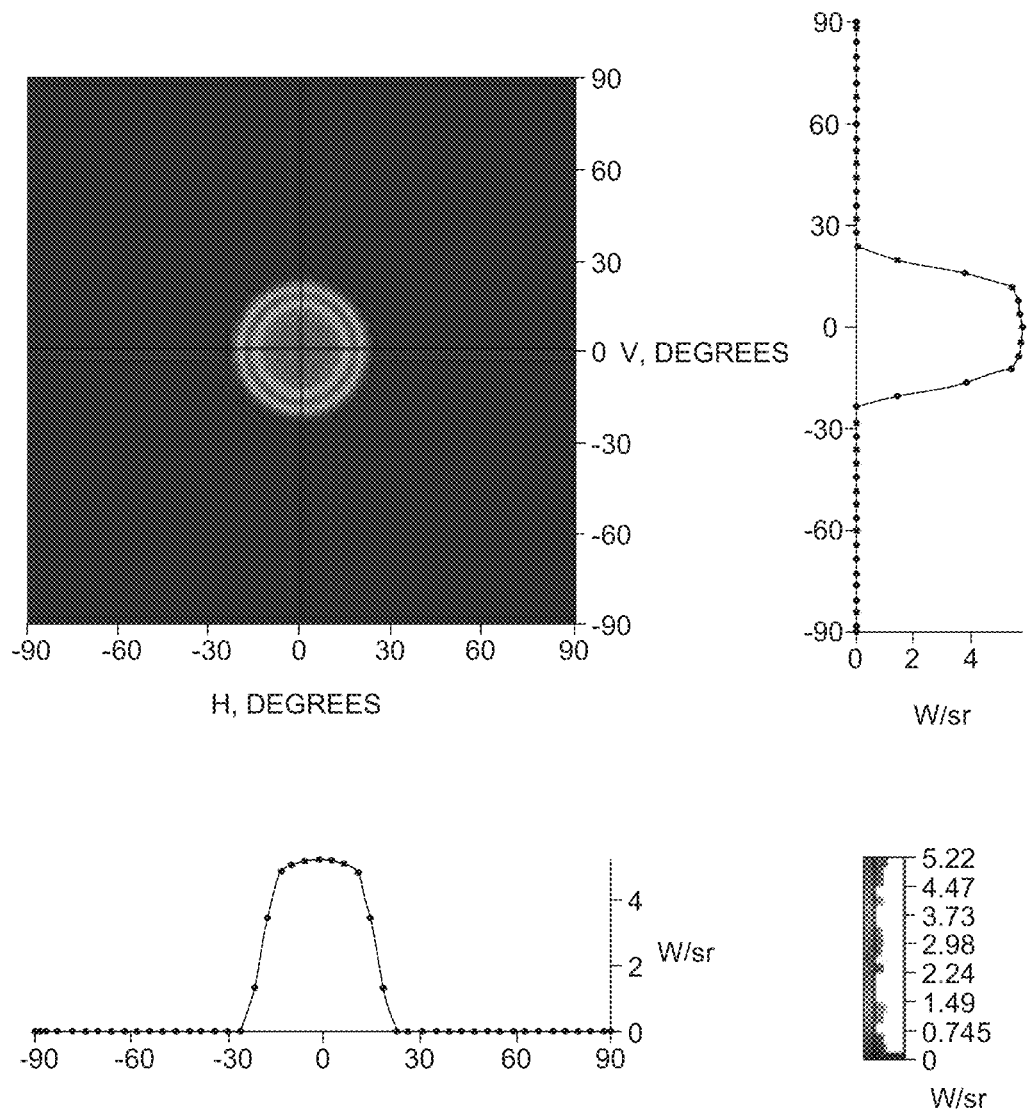
FIG. 4A to FIG. 4D are light distribution simulation results according to the comparative example and an exemplary embodiment of the present disclosure.
Figure 4B:
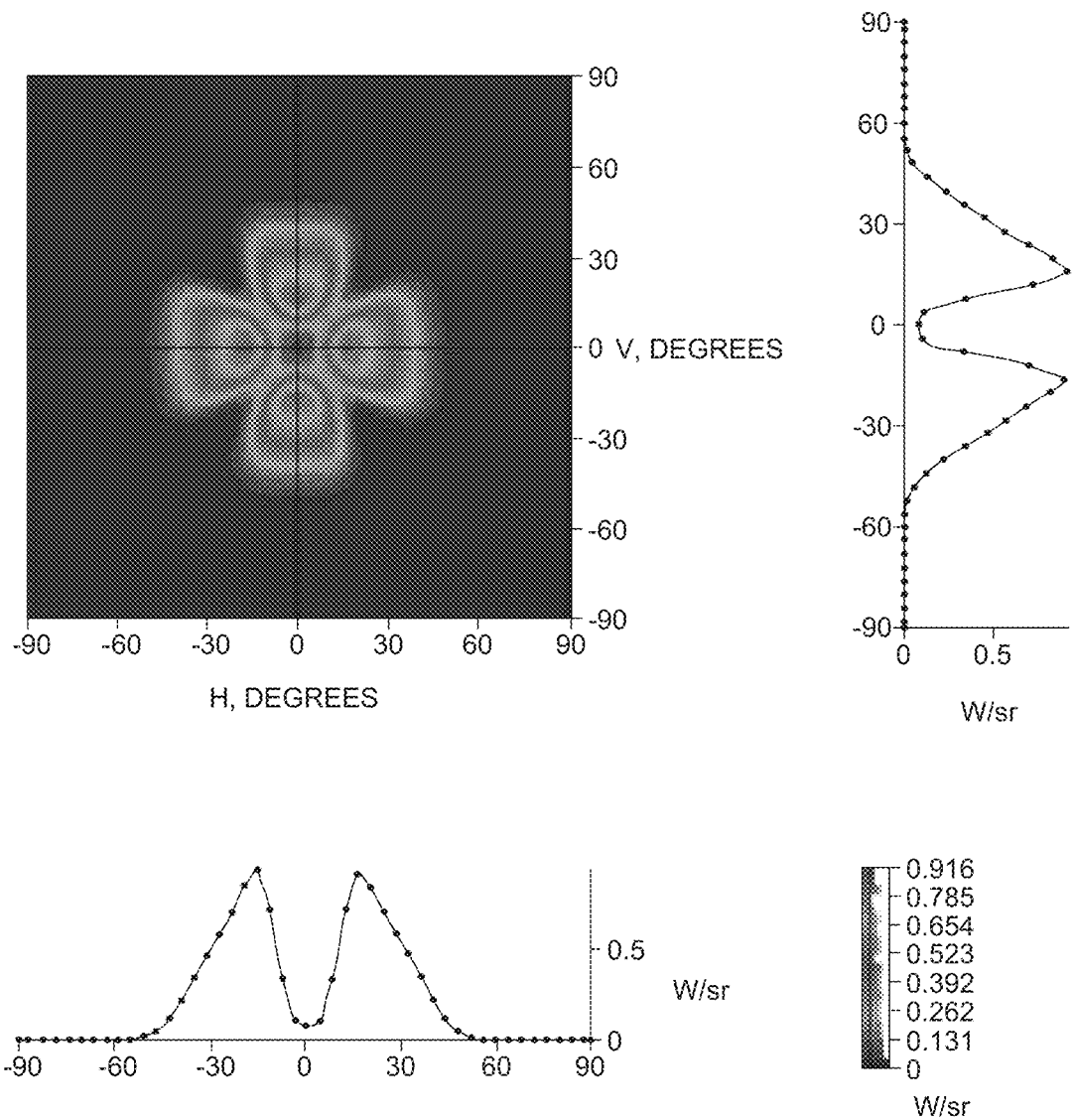
Figure 4C:
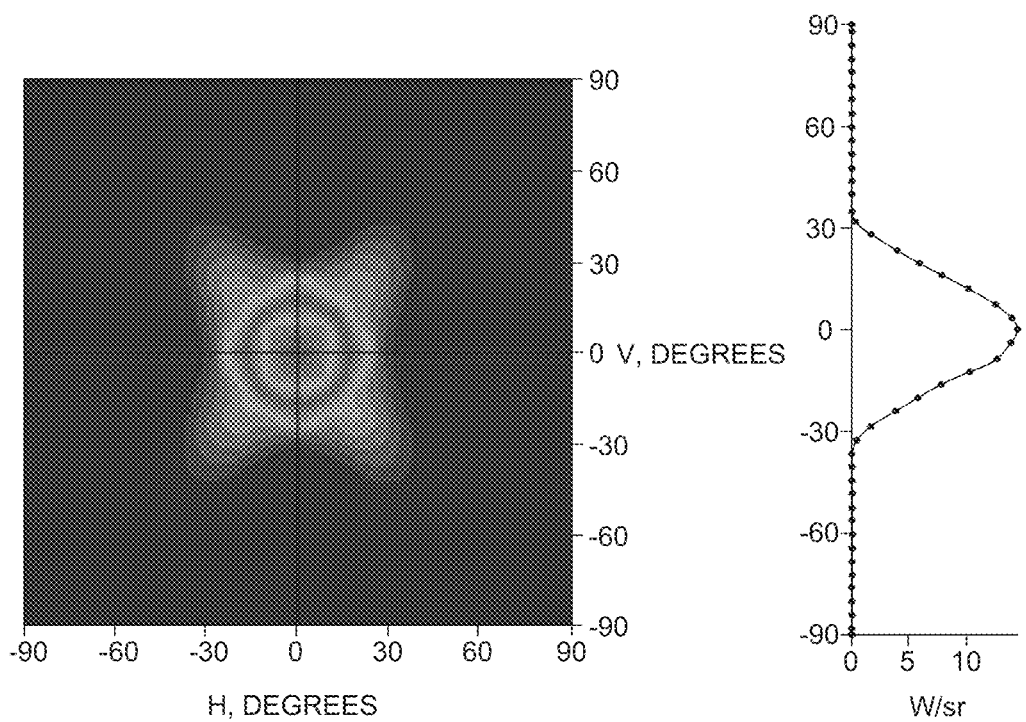
Figure 4C:
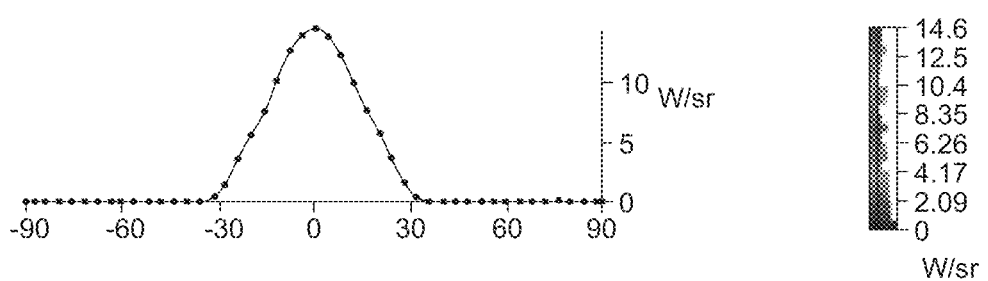
Figure 4D:
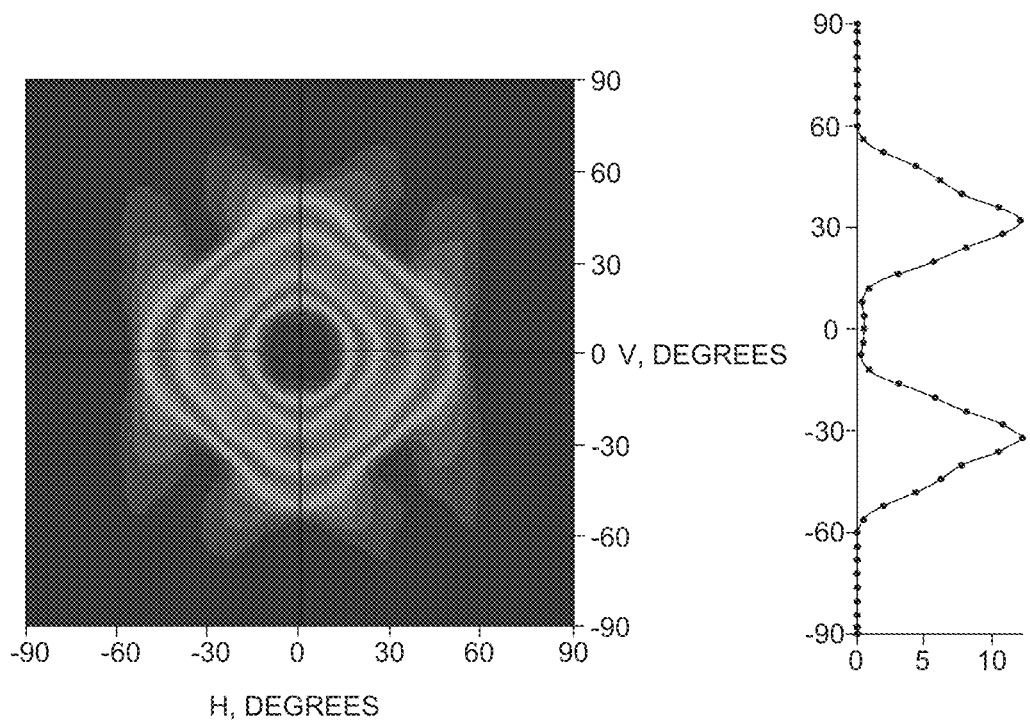
Figure 4D:
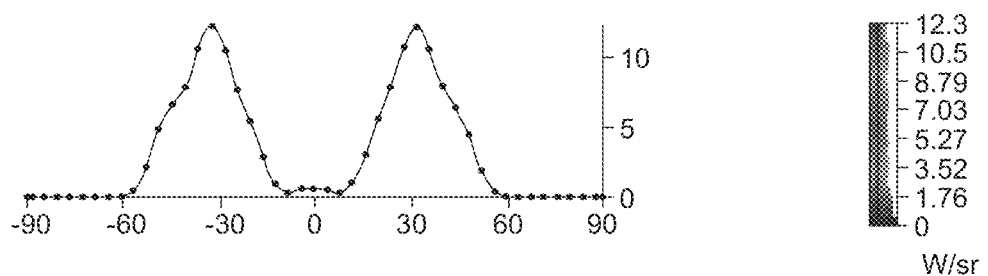

FIG. 4A is a light distribution simulation result when the light emitting element 30 has a light emission angle of 0 to 10 degrees in the light emitting display apparatus of the comparative example shown in FIG. 3A. FIG. 4B is a light distribution simulation result of Exemplary Embodiment 1 when the light emitting element 130 has a light emission angle of 0 to 10 degrees in the light emitting display apparatus 100 according to an exemplary embodiment of the present disclosure shown in FIG. 3B. FIG. 4C is a light distribution simulation result of Exemplary Embodiment 2 when the light emitting element 130 has a light emission angle of 11 degrees to 20 degrees in the light emitting display apparatus 100 according to an exemplary embodiment of the present disclosure shown in FIG. 3B. FIG. 4D is a light distribution simulation result of Exemplary Embodiment 3 when the light emitting element 130 has a light emission angle of 21 degrees to 30 degrees in the light emitting display apparatus 100 according to an exemplary embodiment of the present disclosure shown in FIG. 3B. In addition, in the case of the light emitting display apparatus 100 of Exemplary Embodiment 4, the light emitting element 130 of the light emitting display apparatus 100 according to an exemplary embodiment of the present disclosure shown in FIG. 3B has a light emission angle of 31 degrees to 40 degrees.

Front brightness and total light emission flux values of the comparative example and the exemplary embodiment 1 to the exemplary embodiment 4 according to the light distribution simulation results are shown in Table 1.

TABLE 1

|  | Comparative Example 1 | Exemplary Embodiment 1 | Exemplary Embodiment 2 | Exemplary Embodiment 3 | Exemplary Embodiment 4 |
| --- | --- | --- | --- | --- | --- |
| Total Light Emission flux | 54.4 | 54.4 | 146.8 | 221.6 | 269.6 |
| Front Brightness (a.u.) | 5.22 | 0.07 | 14.6 | 0.59 | 0.09 |

First, in the total light emission flux, it could be confirmed that the exemplary embodiment 1 has the same light emission flux value as the comparative example 1, but in the exemplary embodiments 2 to 4, the total light emission flux increases in accordance with an increase in the light emission angle, whereby the amount of light emitted increases as compared to the comparative example.

Next, with reference to FIG. 4C, in the exemplary embodiment 2, it could be confirmed that when the light emission angle is 11 degrees to 20 degrees, the total light emission flux increases and at the same time, front brightness is twice or more than that of the comparative example.

In the exemplary embodiments 3 and 4, it could be confirmed that the total light emission flux increases but front brightness decreases, as compared to the exemplary embodiment 2.

Accordingly, in the light emitting display apparatus 100 according to the exemplary embodiment of the present disclosure, the light emitting element 130 was configured such that the light emission angle of the light emitted from the light emitting element 130 is 11 degrees to 20 degrees, and the light collecting part 170 was disposed on the encapsulation part 150, whereby the total light emission flux and front brightness could be simultaneously increased. A more detailed description of the configuration of the light emitting element 130 will be provided with reference to FIG. 5 to FIG. 6C.

Figure 5:
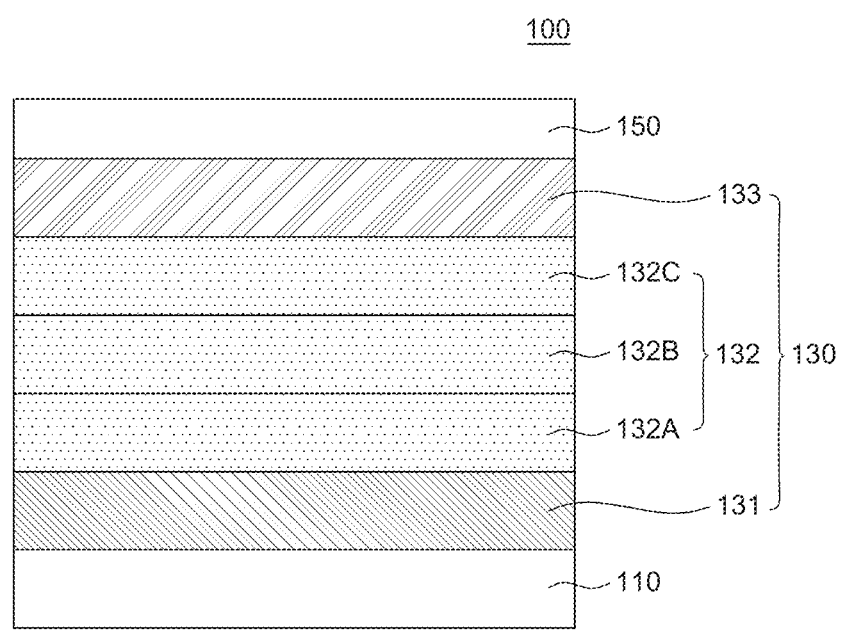
FIG. 5 is a schematic cross-sectional view of an exemplary embodiment of the present disclosure.
Figure 6A:
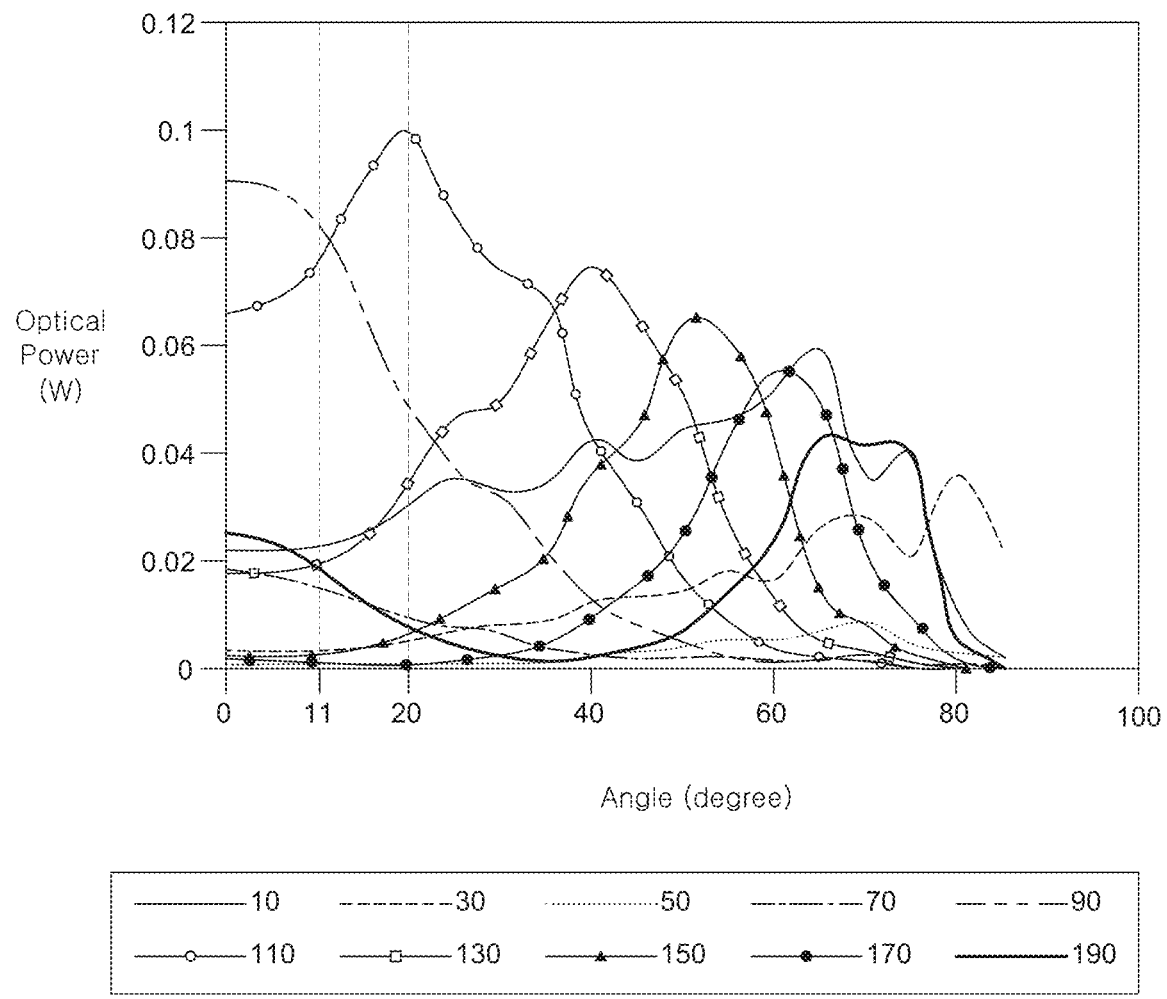
FIG. 6A to FIG. 6C are simulation graphs of optical power to a light emission angle according to a variance in thickness of a hole transporting layer in an exemplary embodiment.
Figure 6B:
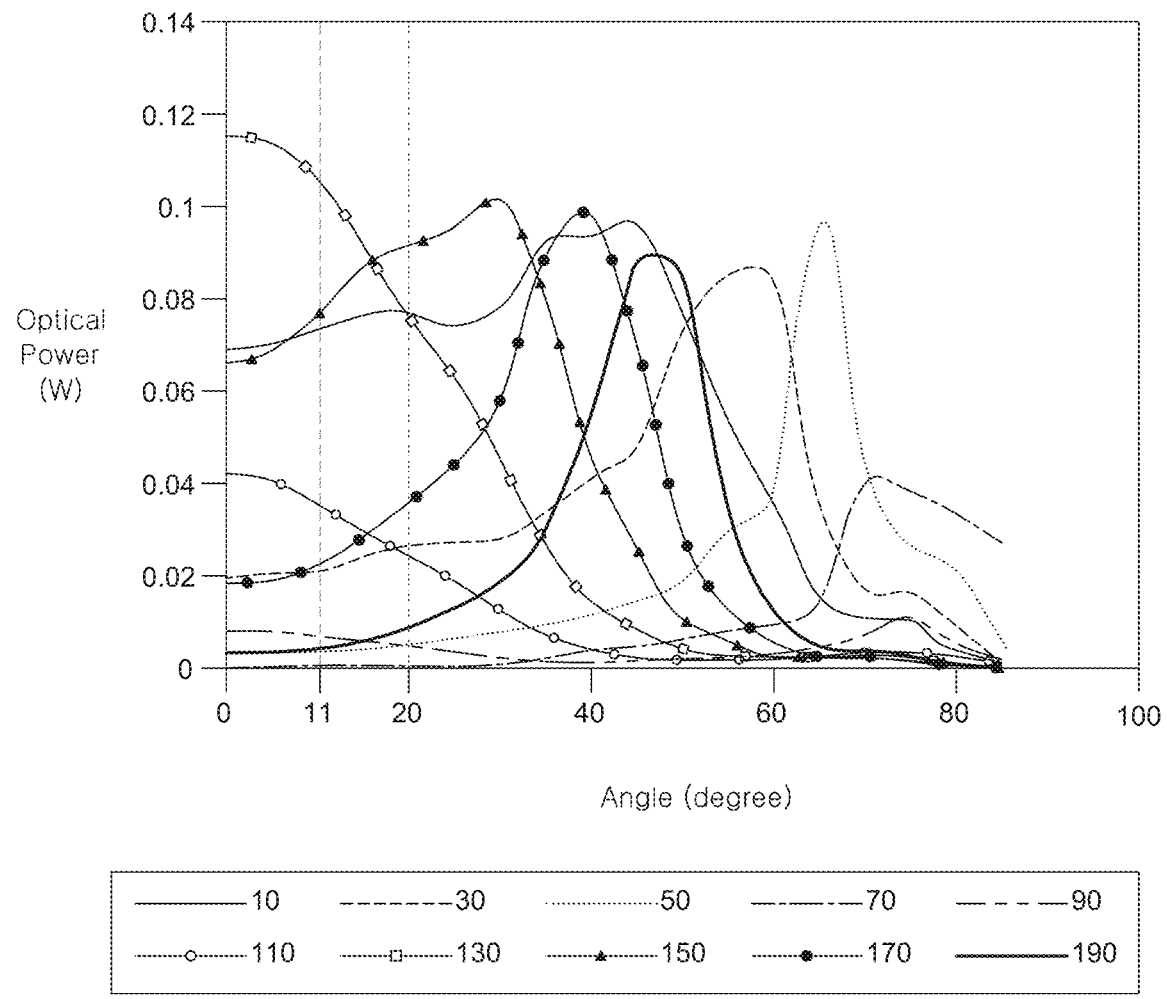
Figure 6C:
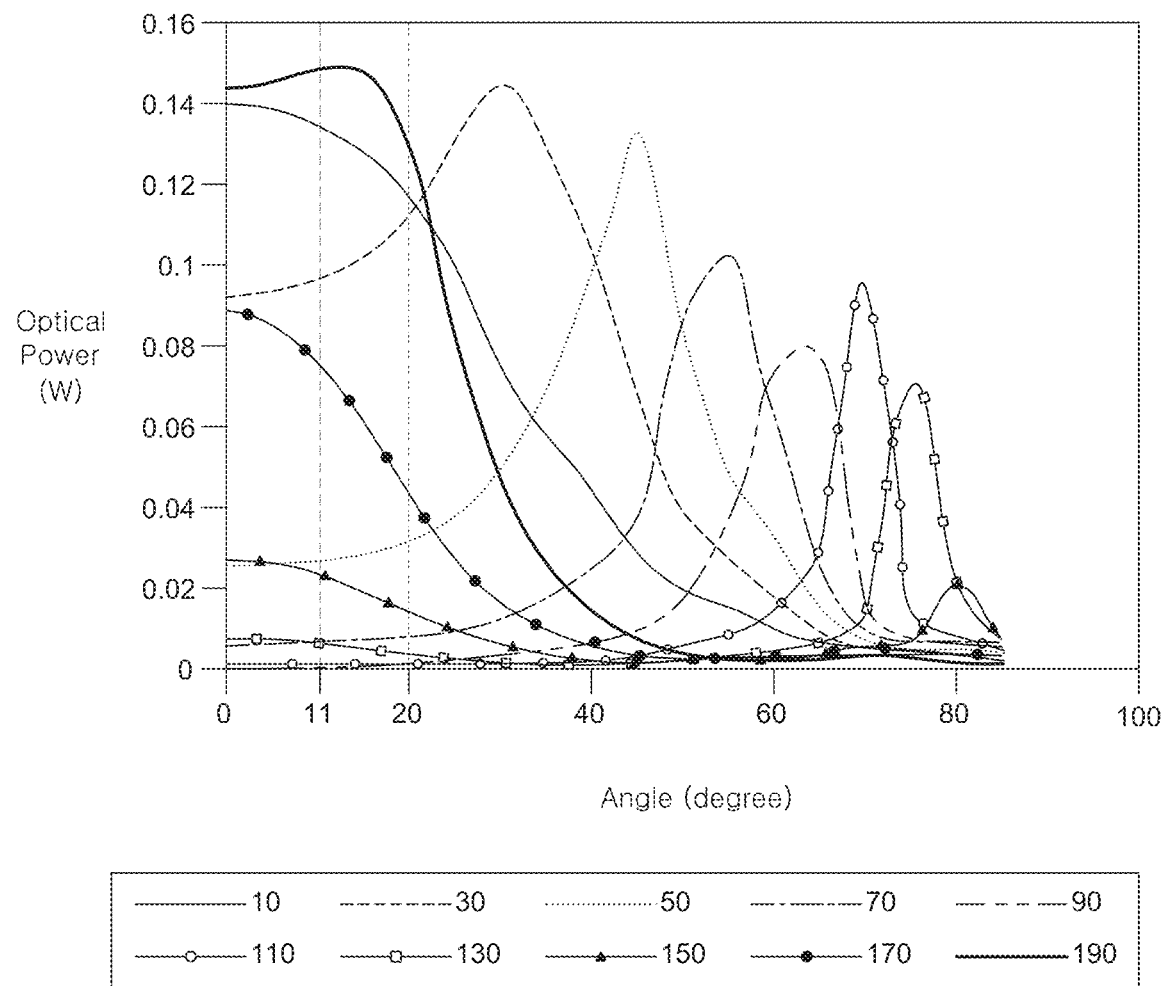

FIG. 5 is a schematic cross-sectional view of an exemplary embodiment of the present disclosure. FIG. 6A to FIG. 6C are simulation graphs of optical power to a light emission angle according to a variance in thickness of a hole transporting layer in an exemplary embodiment.

First, the embodiment illustrated in FIG. 5 schematically illustrates the light emitting display apparatus 100 according to an exemplary embodiment of the present disclosure. For simulation, in the light emitting display apparatus 100, it was assumed that a silver-palladium-copper alloy (APC) is disposed as the first electrode 131 on the substrate 110 formed of glass; a hole transporting layer 132A, an organic light emitting layer 132B and an electron transporting layer 132C of the light emitting layer 132 are sequentially disposed on the first electrode 131; a magnesium-silver alloy (Mg:Ag) is disposed as the second electrode 133 on the light emitting layer 132; and a layer having a refractive index of 1.8 is disposed as the encapsulation part 150 on the second electrode 133. Since light distribution of light incident on the light collecting part 170 is important, the light collecting part 170 on the encapsulation part 150 was not included in a simulation structure, and light distribution within the encapsulation part 150 was simulated.

Next, FIGS. 6A to 6C are simulation graphs of optical power to a light emission angle according to a variance in thickness of the hole transporting layer 132A for each of a blue sub-pixel, a green sub-pixel, and a red sub-pixel among the plurality of sub-pixels SP. The thickness of the hole transporting layer 132A shown in FIGS. 6A to 6C is in the unit of nm (nanometer). As the simulation, a thin film optical simulation was performed, and light distribution simulation within the encapsulation part 150 was performed. For the blue sub-pixel, light distribution at the central wavelength of 462 nm was measured, and it was assumed that a thickness of the organic light emitting layer 132B and the electron transporting layer 132C of the blue sub-pixel is 100 nm. For the green sub-pixel, light distribution at the central wavelength of 528 nm was measured, and it was assumed that the thickness of the organic light emitting layer 132B and the electron transporting layer 132C of the green sub-pixel is 140 nm. For the red sub-pixel, light distribution at the central wavelength of 628 nm was measured, and it was assumed that the thickness of the organic light emitting layer 132B and the electron transporting layer 132C of the blue sub-pixel is 210 nm.

First, with reference to FIG. 6A, in the case of the blue sub-pixel, it was confirmed that when the hole transporting layer 132A has a thickness of 90 nm to 110 nm, a maximum optical power exhibits at a light emission angle of 11 degrees to 20 degrees. Accordingly, in the light emitting element 130 disposed in the blue sub-pixel of the light emitting display apparatus 100 according to an exemplary embodiment of the present disclosure, the hole transporting layer 132A has a thickness of 90 nm to 110 nm, and the thickness of the light emitting layer 132 which is the sum of thicknesses of the hole transporting layer 132A, the blue light emitting layer, and the electron transporting layer 132C can be 190 nm to 210 nm. Accordingly, the thickness of the hole transporting layer 132A can be about 47.4% to 52.4% of the sum of the thicknesses of the hole transporting layer 132A, the blue light emitting layer, and the electron transporting layer 132C.

Next, with reference to FIG. 6B, in the green sub-pixel, it was confirmed that when the hole transporting layer 132A has a thickness of 130 nm to 150 nm, a maximum optical power exhibits at a light emission angle of 11 degrees to 20 degrees. Accordingly, in the light emitting element 130 disposed in the green sub-pixel of the light emitting display apparatus 100 according to an exemplary embodiment of the present disclosure, the hole transporting layer 132A has a thickness of 130 nm to 150 nm, and the thickness of the light emitting layer 132 which is the sum of thicknesses of the hole transporting layer 132A, the green light emitting layer, and the electron transporting layer 132C can be 270 nm to 290 nm. Accordingly, the thickness of the hole transporting layer 132A can be about 48.1% to 51.7% of the sum of the thicknesses of the hole transporting layer 132A, the green light emitting layer, and the electron transporting layer 132C.

Next, with reference to FIG. 6C, in the red sub-pixel, it was confirmed that when the hole transporting layer 132A has a thickness of 190 nm, a maximum optical power exhibits at a light emission angle of 11 degrees to 20 degrees. Accordingly, in the light emitting element 130 disposed in the red sub-pixel of the light emitting display apparatus 100 according to an exemplary embodiment of the present disclosure, the hole transporting layer 132A has a thickness of 190 nm, and the thickness of the light emitting layer 132 which is the sum of thicknesses of the hole transporting layer 132A, the red light emitting layer, and the electron transporting layer 132C can be 400 nm. Accordingly, the thickness of the hole transporting layer 132A can be about 47.5% of the sum of the thicknesses of the hole transporting layer 132A, the red light emitting layer, and the electron transporting layer 132C.

In the light emitting display apparatus 100 according to an exemplary embodiment of the present disclosure, light extraction efficiency of the light emitting display apparatus 100 can be improved by disposing the light collecting part 170 on the encapsulation part 150, simultaneously with adjusting the light emission angle of the light emitting element 130. As described above, in the light emitting display apparatus 100 according to the exemplary embodiment of the present disclosure, the thickness of the hole transporting layer 132A can be differently formed for each of the sub-pixels SP and thicknesses of the entirety of the light emitting layers 132 can be differently configured. Accordingly, the light emitting element 130 can be configured to have a maximum optical power at a light emission angle of 11 degrees to 20 degrees. In addition, light emitted at the above-mentioned light emission angle can be concentrated in the front direction at the interface between the plurality of light collecting patterns 171 and the organic layer 172 of the light collecting part 170. Therefore, in the light emitting display apparatus 100 according to the exemplary embodiment of the present disclosure, light extraction efficiency, particularly, front light extraction efficiency, can be improved.

Some of the light emitted from the light emitting element 130 of the light emitting display apparatus 100 according to the exemplary embodiment of the present disclosure can be totally reflected at the interface between the plurality of light collecting patterns 171 and the organic layer 172 and can travel inwardly of the light emitting display apparatus 100. In addition, light reflected from a component formed of a metal material in the light emitting display apparatus 100 can travel back to the interface between the plurality of light collecting patterns 171 and the organic layer 172. Therefore, in a process in which the light emitted from the light emitting element 130 is reflected from the interface between the plurality of light collecting patterns 171 and the organic layer 172 and the component formed of a metal material in the light emitting display apparatus 100, light of various wavelengths can be mixed. Accordingly, mixed light of various wavelengths is theoretically trapped in the light emitting display apparatus 100, but in practice, a traveling path of the light is slightly changed by the surface roughness of a surface onto which the light is incident, and a total reflection condition is broken, whereby the light can be emitted outwardly of the light emitting display apparatus 100. Accordingly, the light emitting display apparatus 100 according to the exemplary embodiment of the present disclosure can allow for improvements in a color viewing angle.

Figure 7:
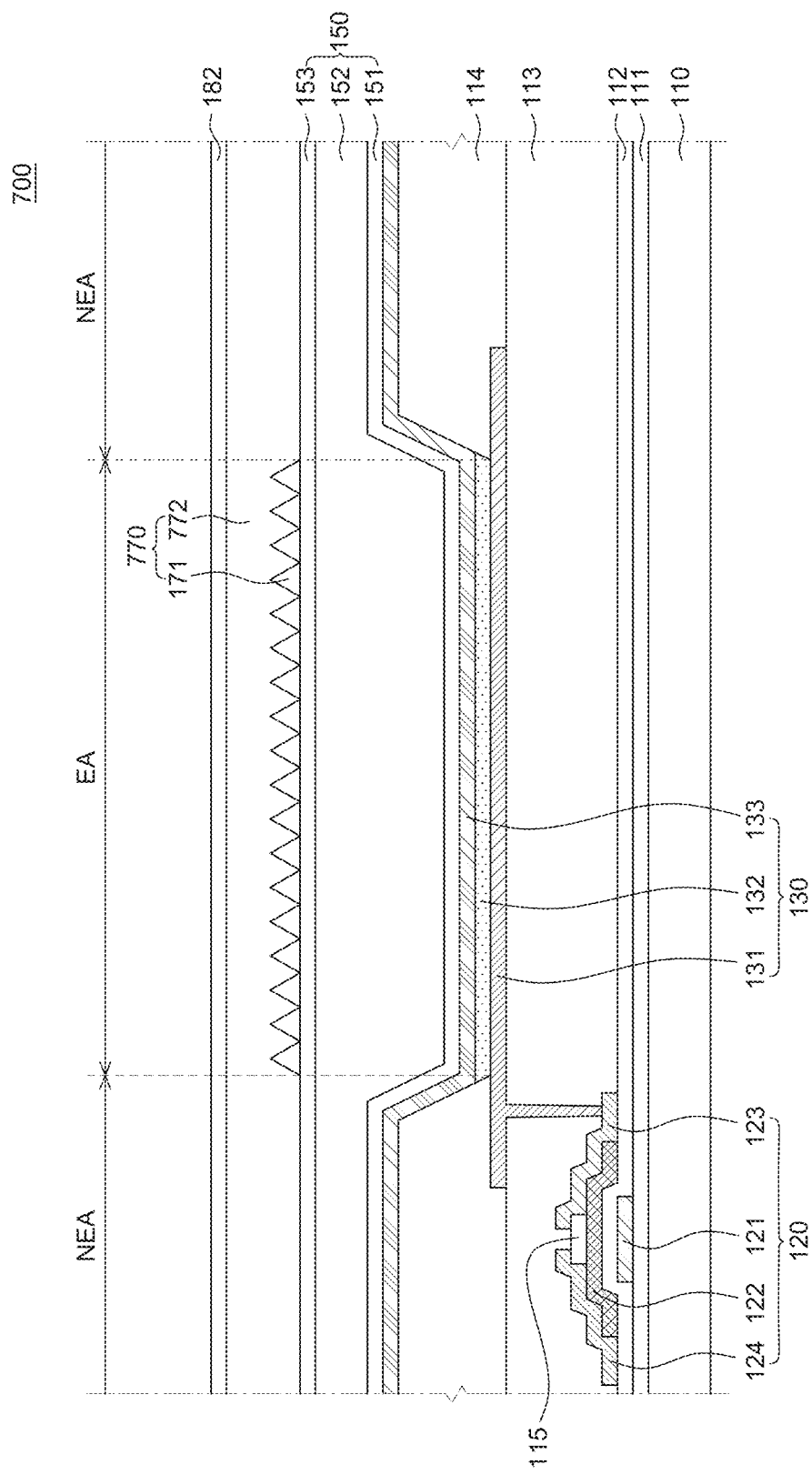
FIG. 7 is a schematic cross-sectional view of a light emitting display apparatus according to another exemplary embodiment of the present disclosure.

FIG. 7 is a schematic cross-sectional view of a light emitting display apparatus according to another exemplary embodiment of the present disclosure.

A light emitting display apparatus 700 of FIG. 7 is different from the light emitting display apparatus 100 of FIGS. 1 and 2 in terms of a light collecting part 770, but other configurations thereof are substantially the same as those of the light emitting display apparatus 100 of FIGS. 1 and 2. Thus, a redundant description will be briefly provided or omitted.

With reference to FIG. 7, the light collecting part 770 is disposed on the encapsulation part 150. The light collecting part 770 is configured to collect the light emitted from the light emitting element 130, in a front direction, rather than at a light emission angle. The light collecting part 770 includes the plurality of light collecting patterns 171 and an organic layer 772. The plurality of light collecting patterns 171 can be the same as the plurality of light collecting patterns 171 which are described with reference to FIGS. 1 and 2.

The organic layer 772 is disposed on the plurality of light collecting patterns 171. The organic layer 772 can be disposed to planarize the plurality of light collecting patterns 171 and can be as a planarization layer. The organic layer 772 can be disposed not only in the light emitting area EA but also in the non-light emitting area NEA, and can be disposed in the entirety of the display area A/A.

The organic layer 772 can be formed of a material having a refractive index lower than a refractive index of the plurality of light collecting patterns 171. In addition, the organic layer 772 can be formed of a material capable of planarizing the upper portions of the plurality of light collecting patterns 171 and capable of bonding the polarizing plate 182 disposed thereon. Accordingly, the organic layer 772 can be formed of an adhesive layer. For example, an acrylic-based polymer can be used as the organic layer 772 and can have a refractive index of about 1.5 to 1.6. As long as the refractive index of the organic layer 772 is lower than that of the plurality of light collecting patterns 171 and the organic layer 772 has adhesive properties, a material for configuring the organic layer 772 is not limited thereto.

In the light emitting display apparatus 700 according to another embodiment of the present disclosure, light extraction efficiency of the light emitting display apparatus 700 can be improved by disposing the light collecting part 770 on the encapsulation part 150, simultaneously with adjusting the light emission angle of the light emitting element 130. For example, in the light emitting display apparatus 700 according to another embodiment of the present disclosure, the light emitting element 130 is configured to have a maximum optical power at a light emission angle of 11 degrees to 20 degrees, and the light emitted from the light emitting element 130 can be collected in the front direction at an interface between the plurality of light collecting patterns 171 and the organic layer 772. Accordingly, in the light emitting display apparatus 700 according to another embodiment of the present disclosure, light extraction efficiency, in particular, front light extraction efficiency, can be improved.

In addition, in the light emitting display apparatus 700 according to another embodiment of the present disclosure, the organic layer 772 disposed on the plurality of light collecting patterns 171 to planarize the upper portions of the plurality of light collecting patterns 171 can function as an adhesive layer. Thus, the organic layer 772 can perform the function of the adhesive layer together with the function of the planarization layer. Therefore, in the light emitting display apparatus 700 according to another embodiment of the present disclosure, the organic layer 772 functions as a planarization layer and an adhesive layer, whereby the light emitting display apparatus 700 allowing for a decrease in thickness, simultaneously with an improvement in front light extraction efficiency, and allowing for a reduction in a manufacturing time can be implemented.

Figure 8:
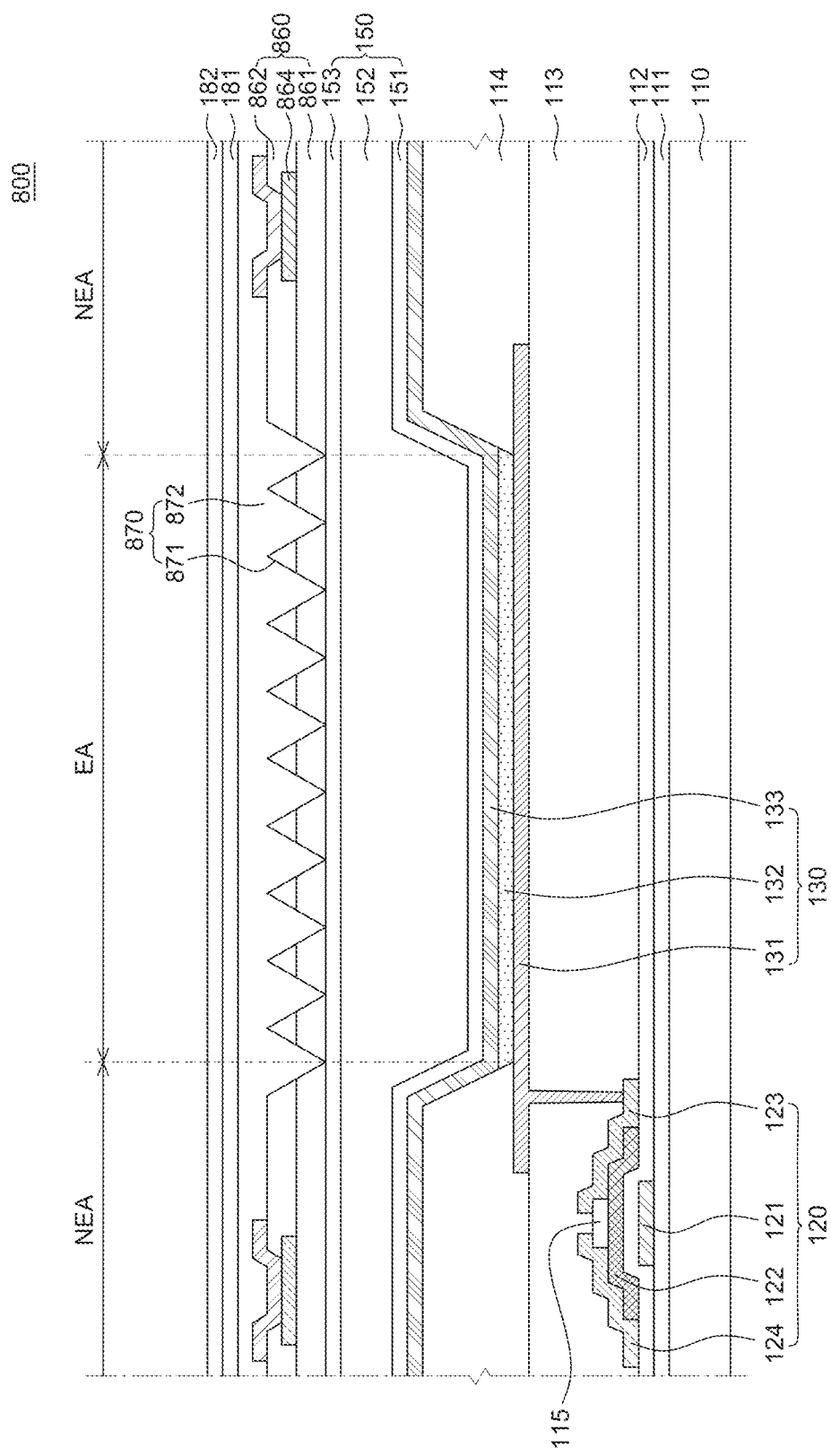
FIG. 8 is a schematic cross-sectional view of a light emitting display apparatus according to another exemplary embodiment of the present disclosure.

FIG. 8 is a schematic cross-sectional view of a light emitting display apparatus according to another exemplary embodiment of the present disclosure. With the exception that a light collecting part 870 is different and a touch part 860 is further included, other configurations of a light emitting display apparatus 800 of FIG. 8 are substantially the same as those of the light emitting display apparatus 100 of FIGS. 1 and 2. Thus, a redundant description will be briefly provided or omitted.

With reference to FIG. 8, the touch part 860 is disposed on the encapsulation part 150. The touch part 860 can be directly disposed on the encapsulation part 150, for example, an upper surface of the second inorganic encapsulation layer 153 to sense a touch input. The touch part 860 includes a first inorganic insulating layer 861, a second inorganic insulating layer 862, and a touch line 864 on the first inorganic insulating layer 861 or the second inorganic insulating layer 862.

The first inorganic insulating layer 861 is disposed on the encapsulation part 150. The first inorganic insulating layer 861 is in contact with the second inorganic encapsulation layer 153 of the encapsulation part 150. The first inorganic insulating layer 861 can be formed of an inorganic material. For example, it can be formed of an inorganic material such as silicon nitride (SiNx), silicon oxynitride (SiON) or the like, but is not limited thereto.

The touch line 864 is disposed on the first inorganic insulating layer 861. The touch line 864 is disposed in the non-light emitting area NEA, on the first inorganic insulating layer 861. The touch line 864 can be disposed in a row direction or a column direction. The touch line 864 supplies a touch driving signal for driving the touch part 860. Also, the touch line 864 can transmit touch information sensed by the touch part 860 to a driving IC.

The second inorganic insulating layer 862 is disposed on the touch line 864 and the first inorganic insulating layer 861. The second inorganic insulating layer 862 can prevent a short-circuit of the touch line 864 which is disposed to be adjacent thereto. The second inorganic insulating layer 862 can be formed of an inorganic material having the same refractive index as the first inorganic insulating layer 861. For example, the second inorganic insulating layer 862 can be formed of an inorganic material such as silicon nitride SiNx, silicon oxynitride SiON or the like, but is not limited thereto.

A touch electrode is disposed on the first inorganic insulating layer 861 and the second inorganic insulating layer 862. The touch electrode can be disposed in column and row directions. For example, the touch electrode disposed in any one of the row direction or the column direction can be arranged on an upper portion of the first inorganic insulating layer 861. The touch electrode disposed in the other of the row direction or the column direction can be disposed on the second inorganic insulating layer 862, but is not limited thereto. The touch electrode disposed in the column direction and the touch electrode disposed in the row direction can be connected to each other through a bridge electrode and have a mesh structure.

With reference to FIG. 8, the light collecting part 870 is disposed on the encapsulation part 150. The light collecting part 870 is configured to collect the light emitted from the light emitting element 130, in the front direction, rather than at a light emission angle. The light collecting part 870 includes a plurality of light collecting patterns 871 and an organic layer 872.

The plurality of light collecting patterns 871 can be formed of the same material as, and disposed in the same layer as, the first inorganic insulating layer 861 and the second inorganic insulating layer 862 of the touch part 860. For example, the plurality of light collecting patterns 871 can be configured to include a first layer which is formed of the same material as and disposed in the same layer as the first inorganic insulating layer 861, and a second layer which is formed of the same material as and disposed in the same layer as the second inorganic insulating layer 862, the second layer being disposed on the first layer. However, embodiments of the present disclosure are not limited thereto, and the plurality of light collecting patterns 871 can be formed of the same material as, and disposed in the same layer as, any one of the first inorganic insulating layer 861 and the second inorganic insulating layer 862.

The organic layer 872 is disposed on the plurality of light collecting patterns 871 and the touch part 860. The organic layer 872 can be disposed to planarize the plurality of light collecting patterns 871 and the touch part 860, and can be as a planarization layer. The organic layer 872 can be disposed not only in the light emitting area EA but also in the non-light emitting area NEA, and can be disposed in the entirety of the display region A/A.

The organic layer 872 can be formed of a material having a refractive index lower than that of the plurality of light collecting patterns 871. In addition, the organic layer 872 can be formed of a material that can planarize the upper portions of the plurality of light collecting patterns 871 and the touch part 860. For example, an acrylic polymer can be used for the organic layer 872 and can have a refractive index of about 1.5 to 1.6. As long as the refractive index of the organic layer 872 is lower than the refractive index of the plurality of light collecting patterns 871, a material for configuring the organic layer 872 is not limited thereto.

In the light emitting display apparatus 800 according to another embodiment of the present disclosure, light extraction efficiency of the light emitting display apparatus 800 can be improved by disposing the light collecting part 870 on the encapsulation part 150, with adjusting the light emission angle of the light emitting element 130. For example, in the light emitting display apparatus 800 according to another embodiment of the present disclosure, the light emitting element 130 is designed to have a maximum optical power at a light emission angle of 11 degrees to 20 degrees, and the light emitted from the light emitting element 130 can be collected in the front direction at an interface between the plurality of light collecting patterns 871 and the organic layer 872 of the light collecting part 870. Accordingly, in the light emitting display apparatus 800 according to another embodiment of the present disclosure, light extraction efficiency, in particular, front light extraction efficiency, can be improved.

In addition, in the light emitting display apparatus 800 according to another embodiment of the present disclosure, the light collecting part 870 and the touch part 860 can be simultaneously formed. For example, the plurality of light collecting patterns 871 of the light collecting part 870 can be simultaneously formed with the first inorganic insulating layer 861 and the second inorganic insulating layer 862 of the touch part 860, in a manufacturing process of the touch part 860. Therefore, in the light emitting display apparatus 800 according to another embodiment of the present disclosure, as the plurality of light collecting patterns 871 of the light collecting part 870 are simultaneously formed with the touch part 860 in the manufacturing process of the touch part 860, the plurality of light collecting patterns 871 can be formed without an additional manufacturing process therefor. Thus, front light extraction efficiency of the light emitting display apparatus 800 can be improved without an additional manufacturing cost or manufacturing time being caused.

Figure 9:
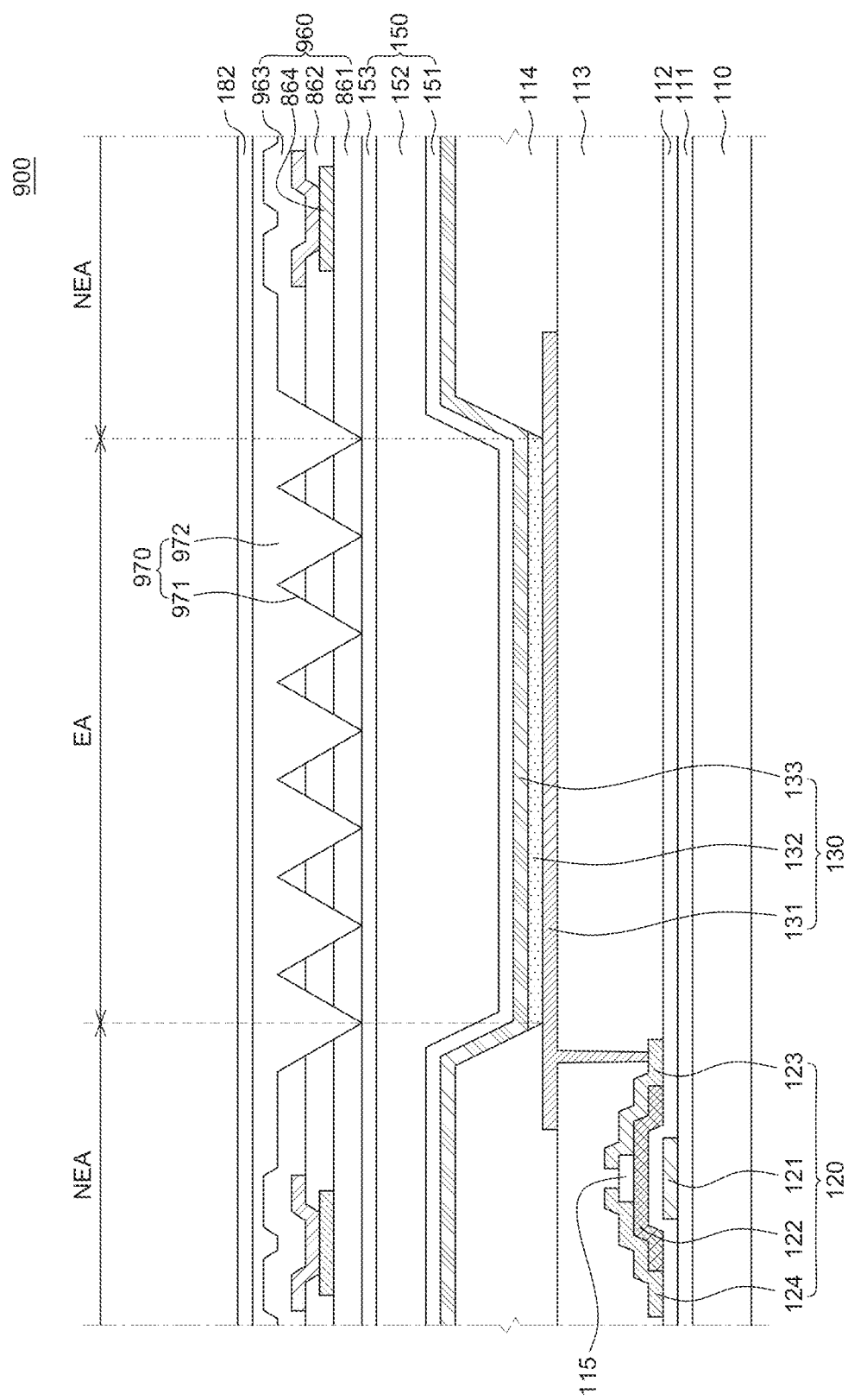
FIG. 9 is a schematic cross-sectional view of a light emitting display apparatus according to another exemplary embodiment of the present disclosure.

FIG. 9 is a schematic cross-sectional view of a light emitting display apparatus according to another exemplary embodiment of the present disclosure. A light emitting display apparatus 900 of FIG. 9 is different from the light emitting display apparatus 800 of FIG. 8, only in terms of a touch part 960 and a light collecting part 970, but other configurations thereof are substantially the same as those of the light emitting display apparatus 800 of FIG. 8. Thus, a redundant description will be briefly provided or omitted.

With reference to FIG. 9, the touch part 960 is disposed on the encapsulation part 150. The touch part 960 is disposed in the display area A/A including the light emitting element 130 to sense a touch input. The touch part 960 includes the first inorganic insulating layer 861, the second inorganic insulating layer 862, a third inorganic insulating layer 963, and the touch line 864 on the first inorganic insulating layer 861 or the second inorganic insulating layer 862.

The third inorganic insulating layer 963 is disposed on the second inorganic insulating layer 862. The third inorganic insulating layer 963 is disposed to cover the second inorganic insulating layer 862 and the touch line 864 to protect components under the third inorganic insulating layer 963.

The third inorganic insulating layer 963 can be formed of a material having the same refractive index as the first inorganic insulating layer 861 and the second inorganic insulating layer 862. For example, it can be formed of an inorganic material such as silicon nitride (SiNx), silicon oxynitride (SiON) or the like, but is not limited thereto.

With reference to FIG. 9, the light collecting part 970 is disposed on the encapsulation part 150. The light collecting part 970 is configured to collect the light emitted from the light emitting element 130, in the front direction, rather than at a light emission angle. The light collecting part 970 includes a plurality of light collecting patterns 971 and an organic layer 972.

The plurality of light collecting patterns 971 can be formed of the same material as, and disposed in the same layer as, the first inorganic insulating layer 861, the second inorganic insulating layer 862 and the third inorganic insulating layer 963 of the touch part 960. For example, the plurality of light collecting patterns 971 can be configured to include a first layer which is formed of the same material as and disposed in the same layer as the first inorganic insulating layer 861; a second layer which is formed of the same material as and disposed in the same layer as the second inorganic insulating layer 862, the second layer being disposed on the first layer; and a third layer which is formed of the same material as and disposed in the same layer as the third inorganic insulating layer 963, the third layer being disposed on the second layer. However, embodiments of the present disclosure are not limited thereto, and the plurality of light collecting patterns 971 can be formed of the same material as, and disposed in the same layer as, at least one of the first inorganic insulating layer 861, the second inorganic insulating layer 862 and the third inorganic insulating layer 963.

The organic layer 972 is disposed on the plurality of light collecting patterns 971 and the touch part 960. The organic layer 972 can be disposed to planarize the plurality of light collecting patterns 971 and the touch part 960 and can be as a planarization layer. The organic layer 972 can be disposed not only in the light emitting area EA but also in the non-light emitting area NEA, and can be disposed in the entirety of the display region A/A.

The organic layer 972 can be formed of a material having a refractive index lower than that of the plurality of light collecting patterns 971. In addition, the organic layer 972 can be formed of a material capable of planarizing the upper portions of the plurality of light collecting patterns 971 and capable of bonding or attaching the polarizing plate 182 disposed thereon. Accordingly, the organic layer 972 can be formed of an adhesive layer. For example, an acrylic-based polymer can be used as the organic layer 972 and can have a refractive index of about 1.5 to 1.6. As long as a refractive index of the organic layer 972 is lower than that of the plurality of light collecting patterns 971 and the organic layer 972 has adhesive properties, a material for configuring the organic layer 972 is not limited thereto.

In the light emitting display apparatus 900 according to another embodiment of the present disclosure, light extraction efficiency of the light emitting display apparatus 900 can be improved by disposing the light collecting part 970 on the encapsulation part 150, simultaneously with adjusting the light emission angle of the light emitting element 130. For example, in the light emitting display apparatus 900 according to another embodiment of the present disclosure, the light emitting element 130 is designed to have a maximum optical power at a light emission angle of 11 degrees to 20 degrees, and the light emitted from the light emitting element 130 can be collected in the front direction at an interface between the plurality of light collecting patterns 971 and the organic layer 972. Accordingly, in the light emitting display apparatus 900 according to another embodiment of the present disclosure, light extraction efficiency, in particular, front light extraction efficiency, can be improved.

In addition, in the light emitting display apparatus 900 according to another embodiment of the present disclosure, the light collecting part 970 and the touch part 960 can be simultaneously formed. For example, the plurality of light collecting patterns 971 of the light collecting part 970 can be simultaneously formed with the first inorganic insulating layer 861, the second inorganic insulating layer 862, and the third inorganic insulating layer 963 of the touch part 960, in a manufacturing process of the touch part 960. Accordingly, in the light emitting display apparatus 900 according to another embodiment of the present disclosure, as the plurality of light collecting patterns 971 of the light collecting part 970 are simultaneously formed with the touch part 960 in the manufacturing process of the touch part 960, the plurality of light collecting patterns 971 can be formed without an additional manufacturing process therefor. Thus, front light extraction efficiency of the light emitting display apparatus 900 can be improved without an additional manufacturing cost or manufacturing time being caused.

In addition, in the light emitting display apparatus 900 according to another embodiment of the present disclosure, the organic layer 972 which is disposed on the plurality of light collecting patterns 971 to planarize upper portions of the plurality of light collecting patterns 971 can function as an adhesive layer. Thus, the organic layer 972 can perform the function of the adhesive layer together with the function of the planarization layer. Accordingly, in the light emitting display apparatus 900 according to another embodiment of the present disclosure, the organic layer 972 can function as a planarization layer and an adhesive layer, whereby the light emitting display apparatus 900 allowing for a decrease in thickness, simultaneously with an improvement in front light extraction efficiency, and allowing for a reduction in a manufacturing time can be implemented.

A light emitting display apparatus according to one or more embodiments of the present disclosure will be described below.

A light emitting display apparatus according to an embodiment of the present disclosure comprises a plurality of light emitting elements on a substrate; an encapsulation part on the plurality of light emitting elements; a plurality of light collecting patterns on the encapsulation part and formed of an inorganic material; and an organic layer on the encapsulation part and the plurality of light collecting patterns and formed of a material having a refractive index lower than a refractive index of the plurality of light collecting patterns.

According to some embodiments of the present disclosure, the plurality of light collecting patterns can be disposed to overlap the plurality of light emitting elements.

According to some embodiments of the present disclosure, the plurality of light collecting patterns can be composed of a plurality of inorganic patterns that are stacked.

According to some embodiments of the present disclosure, the light emitting display apparatus can further comprise a polarizing plate on the organic layer, wherein the organic layer can be an adhesive layer disposed on a lower surface of the polarizing plate.

According to some embodiments of the present disclosure, the light emitting display apparatus can further comprise a polarizing plate on the organic layer, and an adhesive layer on a lower surface of the polarizing plate, an upper surface of the organic layer can be in contact with the adhesive layer.

According to some embodiments of the present disclosure, the light emitting display apparatus can further comprise a touch part on the encapsulating part, wherein the touch part can include a first inorganic insulating layer on the encapsulation part, a second inorganic insulating layer on the first inorganic insulating layer, and a touch line on the first inorganic insulating layer or the second inorganic insulating layer, and the plurality of light collecting patterns can be configured to include a first layer disposed in the same layer as the first inorganic insulating layer, and a second layer on the first layer and disposed in the same layer as the second inorganic insulating layer.

According to some embodiments of the present disclosure, the organic layer can planarize the second inorganic insulating layer and the touch line.

According to some embodiments of the present disclosure, the touch part can further include a third inorganic insulating layer covering the second inorganic insulating layer and the touch line, the light collecting patterns can include a third layer on the second layer and disposed in the same layer as the third inorganic insulating layer.

According to some embodiments of the present disclosure, the first inorganic insulating layer, the second inorganic insulating layer, and the third inorganic insulating layer can be composed with materials having the same refractive index.

According to some embodiments of the present disclosure, a light emission angle of the plurality of light emitting elements can be 11 degrees to 20 degrees.

According to some embodiments of the present disclosure, the plurality of light collecting patterns and the organic layer can refract light emitted from the plurality of light emitting elements in a front direction.

According to some embodiments of the present disclosure, the plurality of light emitting elements can include a red light emitting element, a green light emitting element and a blue light emitting element, and each of the plurality of light emitting elements can include a first electrode, a hole transporting layer, an organic light emitting layer, an electron transporting layer, and a second electrode.

According to some embodiments of the present disclosure, a thickness of the hole transporting layer of the red light emitting element can be 190 nm.

According to some embodiments of the present disclosure, a thickness of the hole transporting layer of the green light emitting element can be 130 nm to 150 nm.

According to some embodiments of the present disclosure, a thickness of the hole transporting layer of the blue light emitting element can be 90 nm to 110 nm.

A light emitting display apparatus according to an embodiment of the present disclosure comprises a substrate including a light emitting area and a non-light emitting area; a light emitting element at the light emitting area, and configured to emit light at a light emission angle; an encapsulation part on the light emitting element; and a light collecting part being in contact with an upper surface of the encapsulation part and configured to collect the light emitted from the light emitting element, in a front direction, rather than at the light emission angle, wherein the light collecting part includes a plurality of light collecting patterns and an organic layer disposed to cover the plurality of light collecting patterns, the organic layer having a refractive index lower than a refractive index of the plurality of light collecting patterns.

According to some embodiments of the present disclosure, the plurality of light collecting patterns can have a shape of any one of a pyramidal lens, a hemispherical lens, a conical lens, a lenticular lens, a prismatic lens, and a concave lens.

According to some embodiments of the present disclosure, the light collecting part can include a surface inclined with respect to a center of the light collecting part, and a vertex angle of the light collecting part can be 60 degrees According to some embodiments of the present disclosure, the light emitting display apparatus can further comprise a polarizing plate on the organic layer, wherein the organic layer can be an adhesive layer that attaches the plurality of light collecting patterns and the polarizing plate.

According to some embodiments of the present disclosure, the light emitting display apparatus can further comprise an adhesive layer in contact with an upper surface of the organic layer; and a polarizing plate in contact with an upper surface of the adhesive layer.

According to some embodiments of the present disclosure, the light emitting display apparatus can further comprise a touch part disposed on the encapsulation part and implemented together with the light collection part.

According to some embodiments of the present disclosure, the light emission angle can be 11 degrees to 20 degrees.

According to some embodiments of the present disclosure, the light emitting element can include a first electrode, a hole transporting layer, a red light emitting layer, an electron transporting layer and a second electrode, and a thickness of the hole transporting layer can be 47.5% of a sum of thicknesses of the hole transporting layer, the red light emitting layer and the electron transporting layer.

According to some embodiments of the present disclosure, the light emitting element can include a first electrode, a hole transporting layer, a green light emitting layer, an electron transporting layer and a second electrode, and a thickness of the hole transporting layer can be 48% to 51.7% of a sum of thicknesses of the hole transporting layer, the green light emitting layer and the electron transporting layer.

According to some embodiments of the present disclosure, the light emitting element can include a first electrode, a hole transporting layer, a blue light emitting layer, an electron transporting layer and a second electrode, and a thickness of the hole transporting layer can be 47.4% to 52.4% of a sum of thicknesses of the hole transporting layer, the blue light emitting layer, and the electron transporting layer.

A light emitting display apparatus according to an embodiment of the present disclosure comprises a substrate including a light emitting area and a non-light emitting area; a light emitting element at the light emitting area, and configured to emit light at a light emission angle; an encapsulation part on the light emitting element; a light collecting part being in contact with an upper surface of the encapsulation part and configured to collect the light emitted from the light emitting element, in a front direction, rather than at the light emission angle, wherein the light collecting part includes a plurality of light collecting patterns and an organic layer disposed to cover the plurality of light collecting patterns, and the organic layer has a refractive index lower than a refractive index of the plurality of light collecting patterns; and a touch part on the encapsulating part, wherein the touch part includes a first inorganic insulating layer on the encapsulation part, a second inorganic insulating layer on the first inorganic insulating layer, and a touch line on the first inorganic insulating layer or the second inorganic insulating layer, and wherein the plurality of light collecting patterns are configured to include a first layer disposed in the same layer as the first inorganic insulating layer, and a second layer on the first layer and disposed in the same layer as the second inorganic insulating layer.

According to some embodiments of the present disclosure, the organic layer can be configured to planarize the second inorganic insulating layer and the touch line.

According to some embodiments of the present disclosure, the touch part can further include a third inorganic insulating layer covering the second inorganic insulating layer and the touch line, and the plurality of light collecting patterns can include a third layer on the second layer and disposed in the same layer as the third inorganic insulating layer.

According to some embodiments of the present disclosure, the first inorganic insulating layer, the second inorganic insulating layer, and the third inorganic insulating layer can be composed with materials having the same refractive index.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:

1. A light emitting display apparatus, comprising:
a plurality of light emitting elements on a substrate;
an encapsulation part on the plurality of light emitting elements;
a plurality of light collecting patterns on the encapsulation part and formed of an inorganic material; and
an organic layer on the encapsulation part and the plurality of light collecting patterns, and formed of a material having a refractive index lower than a refractive index of the plurality of light collecting patterns.

2. The light emitting display apparatus of claim 1, wherein the plurality of light collecting patterns are disposed to overlap the plurality of light emitting elements.

3. The light emitting display apparatus of claim 1, wherein the plurality of light collecting patterns are composed of a plurality of inorganic patterns that are stacked.

4. The light emitting display apparatus of claim 1, further comprising:
a polarizing plate on the organic layer,
wherein the organic layer is an adhesive layer on a lower surface of the polarizing plate.

5. The light emitting display apparatus of claim 1, further comprising:
a polarizing plate on the organic layer; and
an adhesive layer on a lower surface of the polarizing plate,
wherein an upper surface of the organic layer is in contact with the adhesive layer.

6. The light emitting display apparatus of claim 1, further comprising:
a touch part on the encapsulating part,
wherein the touch part includes a first inorganic insulating layer on the encapsulation part, a second inorganic insulating layer on the first inorganic insulating layer, and a touch line on the first inorganic insulating layer or the second inorganic insulating layer, and
wherein the plurality of light collecting patterns are configured to include a first layer disposed in the same layer as the first inorganic insulating layer, and a second layer on the first layer and disposed in the same layer as the second inorganic insulating layer.

7. The light emitting display apparatus of claim 6, wherein the organic layer planarizes the second inorganic insulating layer and the touch line.

8. The light emitting display apparatus of claim 6, wherein the touch part further includes a third inorganic insulating layer covering the second inorganic insulating layer and the touch line, and
wherein the light collecting patterns include a third layer on the second layer and disposed in the same layer as the third inorganic insulating layer.

9. The light emitting display apparatus of claim 8, wherein the first inorganic insulating layer, the second inorganic insulating layer, and the third inorganic insulating layer are composed with materials having the same refractive index.

10. The light emitting display apparatus of claim 1, wherein a light emission angle of the plurality of light emitting elements is approximately 11 degrees to approximately 20 degrees.

11. The light emitting display apparatus of claim 10, wherein the plurality of light collecting patterns and the organic layer refract light emitted from the plurality of light emitting elements in a front direction.

12. The light emitting display apparatus of claim 10, wherein the plurality of light emitting elements include a red light emitting element, a green light emitting element and a blue light emitting element, and
each of the plurality of light emitting elements includes a first electrode, a hole transporting layer, an organic light emitting layer, an electron transporting layer, and a second electrode.

13. The light emitting display apparatus of claim 12, wherein a thickness of the hole transporting layer of the red light emitting element is approximately 190 nm.

14. The light emitting display apparatus of claim 12, wherein a thickness of the hole transporting layer of the green light emitting element is approximately 130 nm to approximately 150 nm.

15. The light emitting display apparatus of claim 12, wherein a thickness of the hole transporting layer of the blue light emitting element is approximately 90 nm to approximately 110 nm.

16. A light emitting display apparatus, comprising:
a substrate including a light emitting area and a non-light emitting area;
a light emitting element at the light emitting area, and configured to emit light at a light emission angle;
an encapsulation part on the light emitting element; and
a light collecting part being in contact with an upper surface of the encapsulation part and configured to collect the light emitted from the light emitting element, in a front direction, rather than at the light emission angle,
wherein the light collecting part includes a plurality of light collecting patterns and an organic layer disposed to cover the plurality of light collecting patterns, the organic layer having a refractive index lower than a refractive index of the plurality of light collecting patterns.

17. The light emitting display apparatus of claim 16, wherein the plurality of light collecting patterns have a shape of any one of a pyramidal lens, a hemispherical lens, a conical lens, a lenticular lens, a prismatic lens, and a concave lens.

18. The light emitting display apparatus of claim 17, wherein the light collecting part includes a surface inclined with respect to a center of the light collecting part, and a vertex angle of the light collecting part is approximately 60 degrees.

19. The light emitting display apparatus of claim 16, further comprising:
a polarizing plate on the organic layer,
wherein the organic layer is an adhesive layer that attaches the plurality of light collecting patterns and the polarizing plate.

20. The light emitting display apparatus of claim 16, further comprising:
an adhesive layer in contact with an upper surface of the organic layer; and
a polarizing plate in contact with an upper surface of the adhesive layer.

21. The light emitting display apparatus of claim 16, further comprising:
a touch part on the encapsulation part and implemented together with the light collection part.

22. The light emitting display apparatus of claim 16, wherein the light emission angle is approximately 11 degrees to approximately 20 degrees.

23. The light emitting display apparatus of claim 16, wherein the light emitting element includes a first electrode, a hole transporting layer, a red light emitting layer, an electron transporting layer and a second electrode, and
wherein a thickness of the hole transporting layer is approximately 47.5% of a sum of thicknesses of the hole transporting layer, the red light emitting layer and the electron transporting layer.

24. The light emitting display apparatus of claim 16, wherein the light emitting element includes a first electrode, a hole transporting layer, a green light emitting layer, an electron transporting layer and a second electrode, and
wherein a thickness of the hole transporting layer is approximately 48% to approximately 51.7% of a sum of thicknesses of the hole transporting layer, the green light emitting layer and the electron transporting layer.

25. The light emitting display apparatus of claim 16, wherein the light emitting element includes a first electrode, a hole transporting layer, a blue light emitting layer, an electron transporting layer and a second electrode, and
wherein a thickness of the hole transporting layer is approximately 47.4% to approximately 52.4% of a sum of thicknesses of the hole transporting layer, the blue light emitting layer, and the electron transporting layer.

26. A light emitting display apparatus, comprising:
a substrate including a light emitting area and a non-light emitting area;
a light emitting element at the light emitting area, and configure to emit light at a light emission angle;
an encapsulation part on the light emitting element;
a light collecting part being in contact with an upper surface of the encapsulation part and configured to collect the light emitted from the light emitting element, in a front direction, rather than at the light emission angle, wherein the light collecting part includes a plurality of light collecting patterns and an organic layer disposed to cover the plurality of light collecting patterns, and the organic layer has a refractive index lower than a refractive index of the plurality of light collecting patterns; and
a touch part on the encapsulating part, wherein the touch part includes a first inorganic insulating layer on the encapsulation part, a second inorganic insulating layer on the first inorganic insulating layer, and a touch line on the first inorganic insulating layer or the second inorganic insulating layer, and wherein the plurality of light collecting patterns are configured to include a first layer disposed in the same layer as the first inorganic insulating layer, and a second layer on the first layer and disposed in the same layer as the second inorganic insulating layer.

27. The light emitting display apparatus of claim 26, wherein the organic layer is configured to planarize the second inorganic insulating layer and the touch line.

28. The light emitting display apparatus of claim 26, wherein the touch part further includes a third inorganic insulating layer covering the second inorganic insulating layer and the touch line, and wherein the plurality of light collecting patterns include a third layer on the second layer and disposed in the same layer as the third inorganic insulating layer.

29. The light emitting display apparatus of claim 28, wherein the first inorganic insulating layer, the second inorganic insulating layer, and the third inorganic insulating layer are composed with materials having the same refractive index.

* * * * *